United States Patent
Murphy

(10) Patent No.: US 11,830,564 B2
(45) Date of Patent: Nov. 28, 2023

(54) DETECTING BIT LINE OPEN CIRCUITS AND SHORT CIRCUITS IN MEMORY DEVICE WITH MEMORY DIE BONDED TO CONTROL DIE

(71) Applicant: SanDisk Technologies LLC, Addison, TX (US)

(72) Inventor: Brian Murphy, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 213 days.

(21) Appl. No.: 17/461,917

(22) Filed: Aug. 30, 2021

(65) Prior Publication Data
US 2023/0061265 A1  Mar. 2, 2023

(51) Int. Cl.
*G11C 29/50* (2006.01)
*H01L 25/065* (2023.01)
(Continued)

(52) U.S. Cl.
CPC .... *G11C 29/50004* (2013.01); *G11C 16/0483* (2013.01); *G11C 16/24* (2013.01); *G11C 16/26* (2013.01); *H01L 24/08* (2013.01); *H01L 25/0657* (2013.01); *H01L 25/18* (2013.01); *G11C 2029/5004* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS 9,236,131 B1  1/2016 Yuan et al.
9,703,719 B2 *  7/2017 Balakrishnan ........ G06F 3/0647
(Continued)

FOREIGN PATENT DOCUMENTS

CN  105340019 B  *  5/2018  ......... G11C 11/5635
CN  105144300 B  *  3/2019  ......... G11C 11/5628
(Continued)

OTHER PUBLICATIONS

Notification of Transmittal of the International Search Report and the Written Opinion of the International Searching Authority dated Aug. 30, 2022, International Patent Application No. PCT/US2022/028221.

*Primary Examiner* — Guerrier Merant
(74) *Attorney, Agent, or Firm* — Vierra Magen Marcus LLP

(57) ABSTRACT

Apparatuses and techniques are presented for detecting bit line open circuits and short circuits in a memory device in which a memory die is inverted and bonded to a control die. In one approach, the control die comprises a set of bit lines which are connected to a set of bit lines of the memory die, and the set of bit lines of the control die comprise ground transistors, e.g., transistors connected to a ground node. Ground transistors of even-numbered bit lines may be commonly controlled, while ground transistors of odd-numbered bit lines are commonly controlled. The ground transistors may be controlled to detect open circuits and short circuits in the bit lines of the control die and the memory die. A laser scanning technique can also be used to determine a physical location of a defect of a bit line.

20 Claims, 18 Drawing Sheets

(51) Int. Cl.
*H01L 25/18* (2023.01)
*H01L 23/00* (2006.01)
*G11C 16/04* (2006.01)
*G11C 16/26* (2006.01)
*G11C 16/24* (2006.01)

(56) References Cited

U.S. PATENT DOCUMENTS

| | | | |
|---|---|---|---|
| 10,665,313 | B1 | 5/2020 | Lu et al. |
| 10,748,894 | B2 | 8/2020 | Chowdhury et al. |
| 2004/0022092 | A1 | 2/2004 | Ran et al. |
| 2006/0133139 | A1 | 6/2006 | Kiyofumi et al. |
| 2010/0157677 | A1 | 6/2010 | Takaaki |
| 2013/0051116 | A1 | 2/2013 | William et al. |
| 2016/0327602 | A1 | 11/2016 | Subramanian et al. |

FOREIGN PATENT DOCUMENTS

| | | | | |
|---|---|---|---|---|
| WO | WO-2016182753 A1 | * | 11/2016 | .......... G06F 12/0811 |
| WO | WO-2016182755 A1 | * | 11/2016 | .......... G06F 12/0811 |

\* cited by examiner

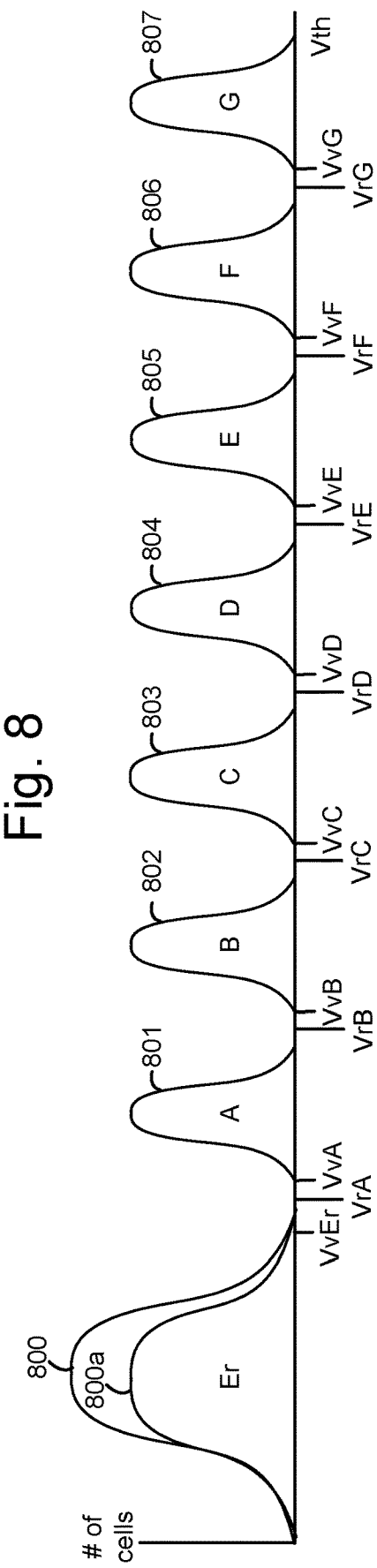

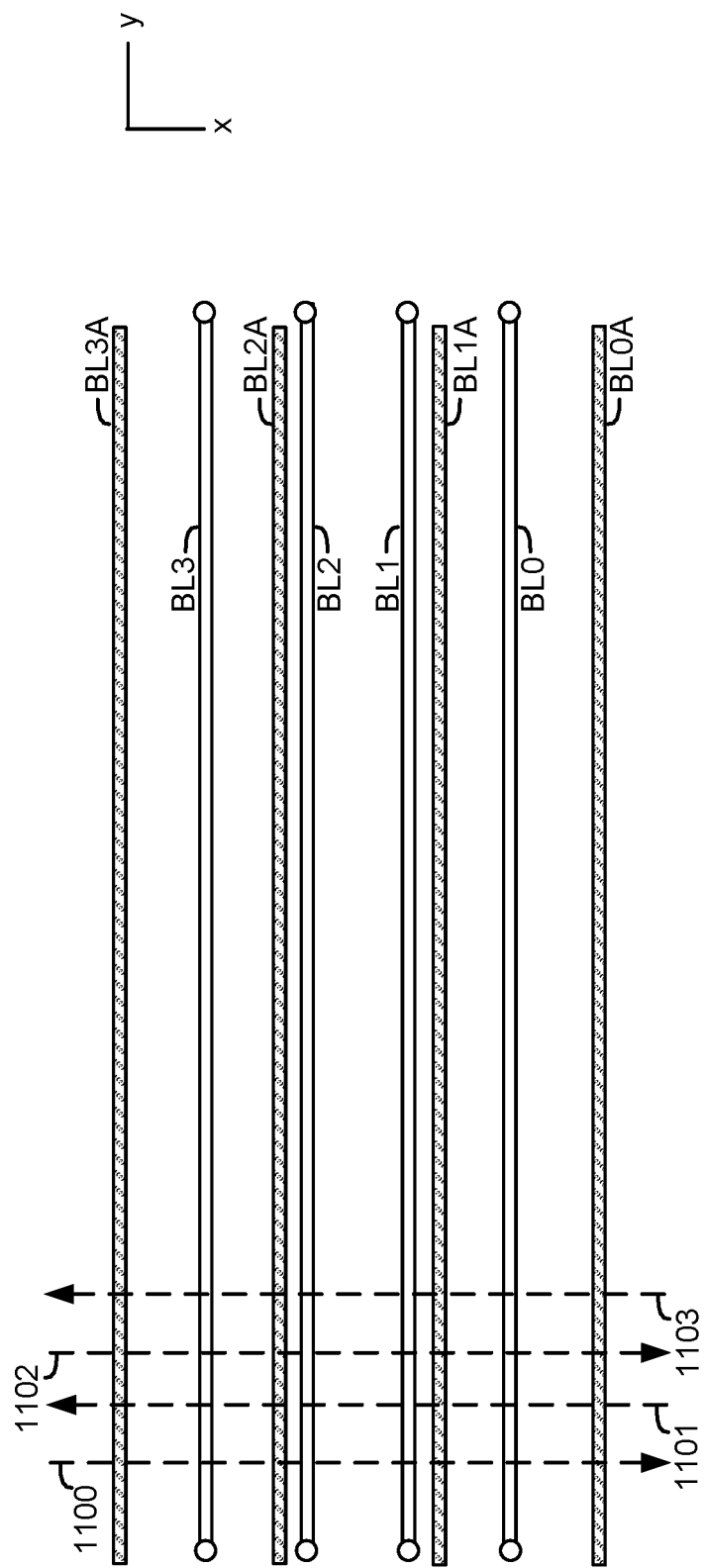

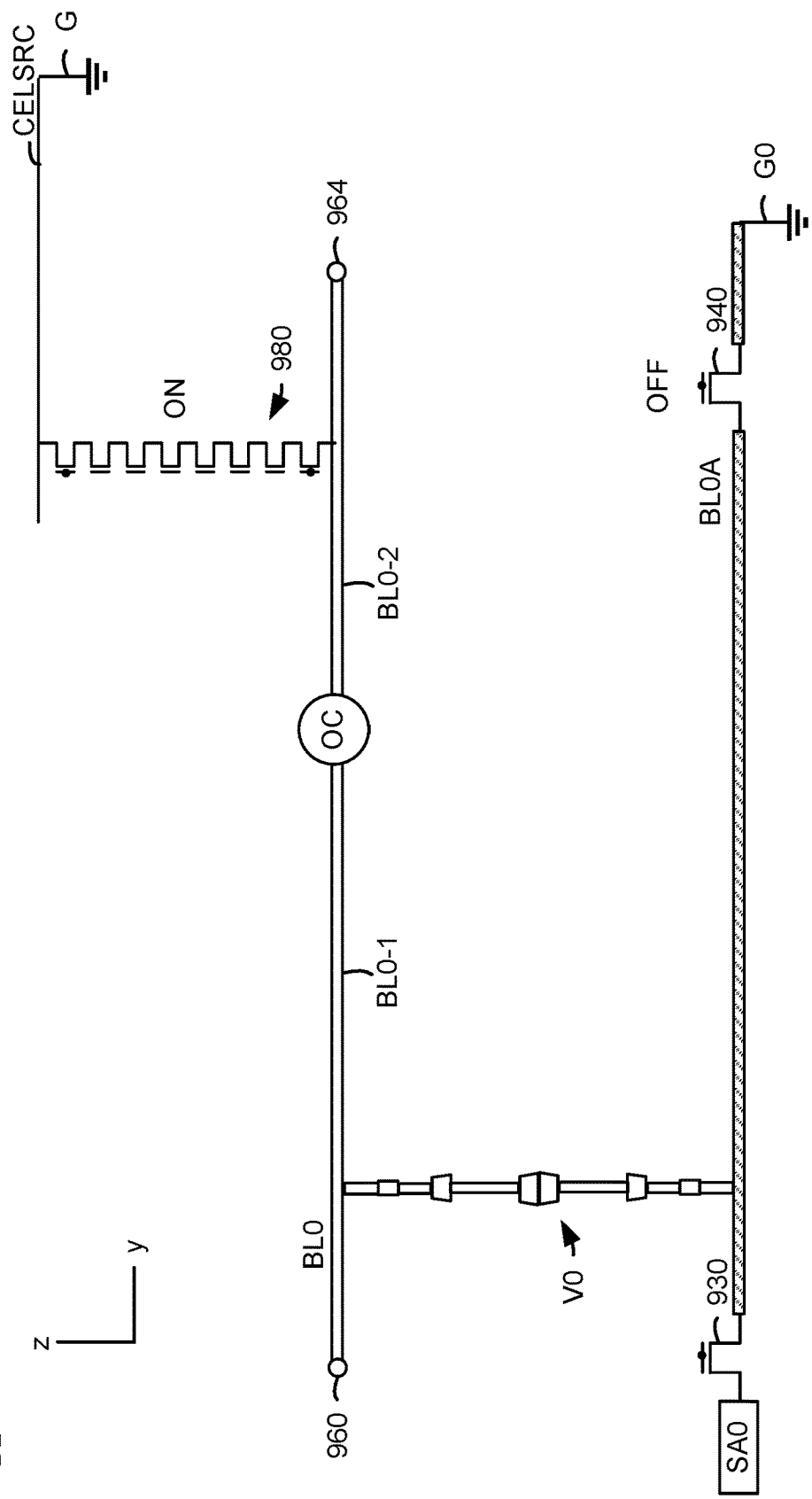

OC on control die
BL

SC on memory die BL

SC on control die
BL

DETECTING BIT LINE OPEN CIRCUITS AND SHORT CIRCUITS IN MEMORY DEVICE WITH MEMORY DIE BONDED TO CONTROL DIE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented by such memory devices.

BRIEF DESCRIPTION OF THE DRAWINGS

FIG. 8 depicts threshold voltage (Vth) distributions for an eight-state memory device.

FIG. 11 depicts a top view of the bit lines of the memory die and the control die of FIG. 9B, showing a raster scan of a laser consistent with FIG. 10H.

FIG. 12A depicts an example configuration of BL0 of the memory die and BL0A of the control die of FIG. 9B when detecting an open circuit in BL0, consistent with FIG. 10B.

DETAILED DESCRIPTION

Figure 1:
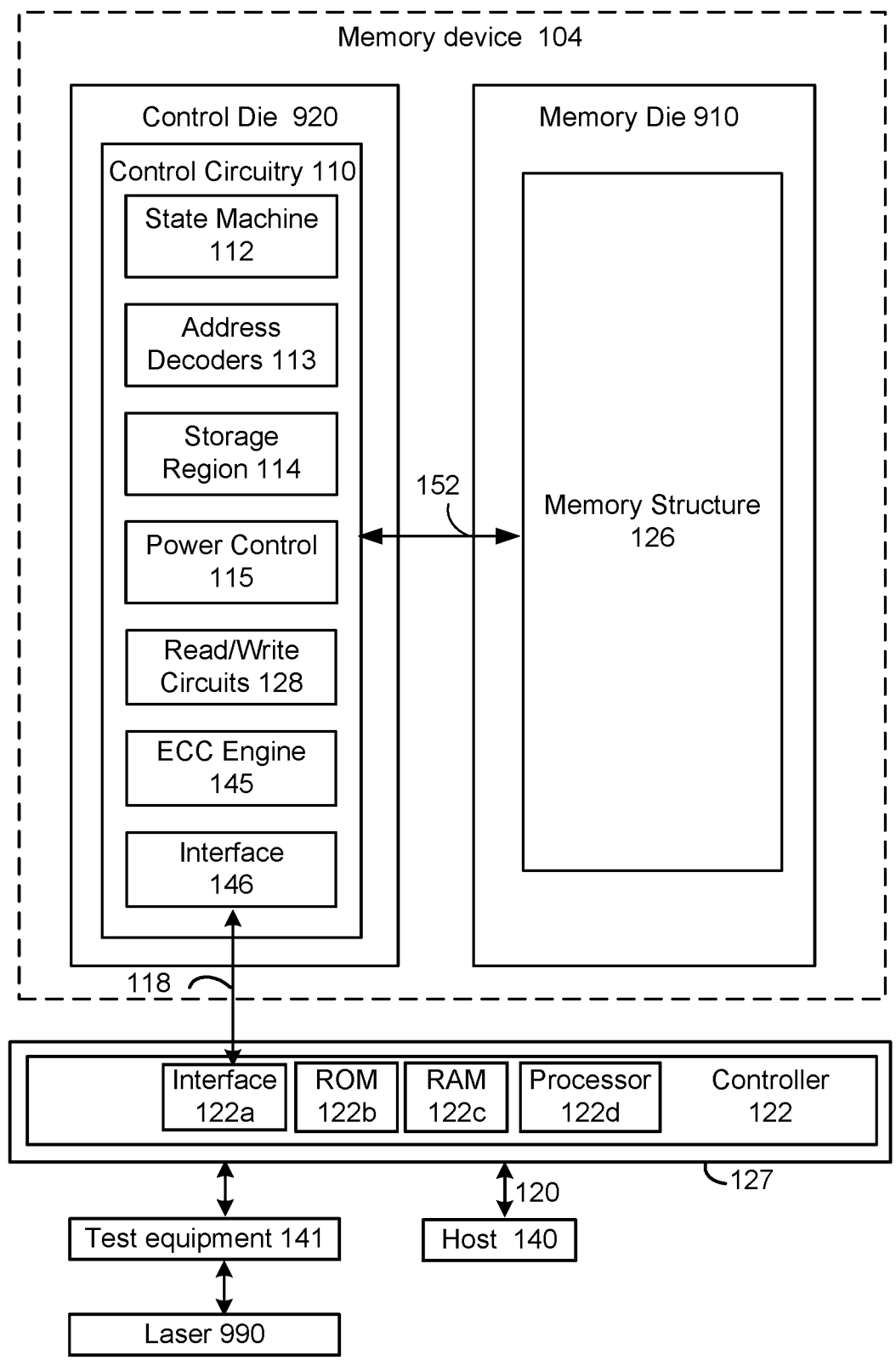
FIG. 1 is a block diagram of an example memory device.

Apparatuses and techniques are presented for detecting bit line open circuits and short circuits in a memory device in which a memory die is inverted and bonded to a control die.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Each NAND string includes various layers which extend vertically in the stack, such as a blocking oxide layer, a charge trapping layer, a tunneling layer and a channel layer.

To provide greater flexibility, the memory structure can be provided on one die, referred to as a memory die, while associated circuits for controlling the memory structure are provided on another die, referred to as a control die. The memory die is then bonded to the control die to provide a functional memory device. This approach, referred to as CBA, or CMOS circuit bonded to memory array, provides various advantages. For example, the control die and the memory die may be fabricated under different optimal conditions before they are bonded to one another. The circuit die may be fabricated under optimal conditions for complementary metal-oxide-semiconductor (CMOS) circuits, for example. Moreover, a common control die may be compatible with different types of memory die, while a common memory die may be compatible with different types of circuits.

However, such memory devices can pose problems in defect detection processes. Such processes can detect defects such as open circuits and short circuits in conductive paths of the memory device. Defect detection is used for bit lines, in particular, which are relatively long conductive paths in the memory device. In some configurations, both the memory die and the control die comprises corresponding sets of bit lines which are connected on a one-to-one basis. Defect detection processes can include the Optical Beam Induced Resistance Change (OBIRCH) process. This process involves moving a laser across the memory device while applying a voltage to a conductive path. If there is a short circuit, a current will flow in the path. The laser changes the resistance of the conductive path which in turn changes the current. A change in the current can be detected by monitoring an input current to the device. Additionally, OBIRCH can be used with Photon Emission Microscopy (PEM) to provide an image which identifies a physical location of a defect. The image shows differences in thermal characteristics between areas containing defects and areas which are defect-free.

Between the bit lines of the control die and the memory die, metal regions can block the transmission of the laser beam. These include vias which connect the bit lines of the two die. In contrast, the laser beam can easily pass through silicon or oxide. As a result, defects in the control die, which is below the memory die from the perspective of the laser, can be difficult to detect.

Techniques provided herein address the above and other issues. In one approach, a control die which is bonded to a memory die comprises a set of bit lines which are connected to a set of bit lines of the memory die, and the set of bit lines of the control die are connected to ground transistors. Ground transistors of even-numbered bit lines may be commonly controlled, while ground transistors of odd-numbered bit lines are commonly controlled. The ground transistors may be controlled to detect open circuits and short circuits in the bit lines of the control die and the memory die. Moreover, an open circuit or short circuit can be identified as being in the control die or memory die.

Once a defective bit line is identified, a laser scanning technique such as OBIRCH can be used to determine a physical location of the defect on the defective bit line.

These and other features are discussed further below.

FIG. 1 is a block diagram of an example memory device. The memory device 104, such as a non-volatile storage system, may include a memory die 910 which is bonded to a control die 920. An arrow 152 represents signals between the two die. The memory die 910, or chip, includes a memory structure 126 of memory cells, such as an array of memory cells. The memory structure 126 is addressable by word lines and bit lines and can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 includes a state machine 112, address decoders 113, a storage region 114, a power control circuit 115, read/write circuits 128, an ECC engine 145 and an interface 146.

The state machine 112 is an electrical circuit that can control operations of the control circuitry 110. In some embodiments, the state machine is implemented by or replaced by a microprocessor, microcontroller and/or RISC processor. In one embodiment, the state machine is programmable by the software. In other embodiments, the state machine does not use software and is completely implemented in hardware (e.g., electrical circuits).

The address decoder 113 provides an address interface between the logical addresses used by the host or a memory controller and the physical, hardware addresses used by row and column decoders of the read/write circuits 128.

The storage region 114 may be provided, e.g., for operational parameters and software/code.

The power control circuit 115 controls the power and voltages supplied to the word lines, select gate lines, bit lines and source lines during memory operations. It can include drivers for bit lines, word lines, SGS and SGD transistors and source lines. See also FIG. 3A. The sense blocks can include the bit line drivers, in one approach.

The read/write circuits 128 include multiple sense blocks (see the example sense block 51 in FIG. 2) and allow a page of memory cells to be read or programmed in parallel.

The error-correction code (ECC) engine 145 can correct a number of read errors.

The interface 146 is used to communicate data and commands to and from the controller 122. Examples of a memory interface (I/F) include the Common Flash Memory Interface of JEDEC.

The controller 122 can be provided on a separate memory die 127. The controller 122 includes an interface 122a, a ROM 122b, a RAM 122c and a processor 122d. Commands and data are transferred between the controller 122 and a host 140 via a data bus 120, and between the interface 122*a* and the interface 146 via lines 118.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, address decoders 113, power control circuit 115, read/write circuits 128, ECC engine 145, controller 122, and so forth.

The controller 122 (which in one embodiment is an electrical circuit) may comprise the interface 122*a*, memory such as ROM 122*b* and RAM 122*c*, and a processor 122*d*. The RAM 122*c* can be a DRAM which stores non-committed data, for example. During programming, a copy of the data to be programmed is stored in the RAM until the programming is successfully completed. In response to the successful completion, the data is erased from the RAM and is committed or released to the block of memory cells. The RAM may store one or more word lines of data.

The memory interface 122*a*, in communication with ROM, RAM and processor, is an electrical circuit that provides an electrical interface between the controller and control die. For example, the memory interface can change the format or timing of signals, provide a buffer, isolate from surges, latch I/O and so forth. The processor 122*d* can issue commands to the control circuitry 110 (or any other component of the control die) via the memory interface 122*a*.

The memory in the controller 122, such as such as ROM and RAM, comprises code such as a set of instructions, and the processor is operable to execute the set of instructions to provide the functionality described herein. Alternatively or additionally, the processor can access code from a subset of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*d* fetches the boot code from the ROM for execution, and the boot code initializes the system components and loads the control code into the RAM. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below. A control circuit can be configured to execute the instructions to perform the functions described herein.

Test equipment 141 can be provided which communicates with the controller 122 and a laser 990. An engineer can use the test equipment to detect an open circuit and/or short circuit of a bit line, for example, using the techniques disclosed herein. Once a defective bit line is identified, the laser can be used to identify a physical location of the defect on the bit line. The test equipment can include a user interface for displaying an image generated by the laser.

In one embodiment, the host 140 is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 6. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

The term "memory die" can refer to a semiconductor die that contains non-volatile memory cells for storage of data. The term "control die" can refer to a semiconductor die that contains control circuitry for the memory die. One example is performing memory operations, such as programming, reading and erasing, on non-volatile memory cells on a memory die. Typically, numerous semiconductor die are formed from a single semiconductor wafer.

Figure 2:
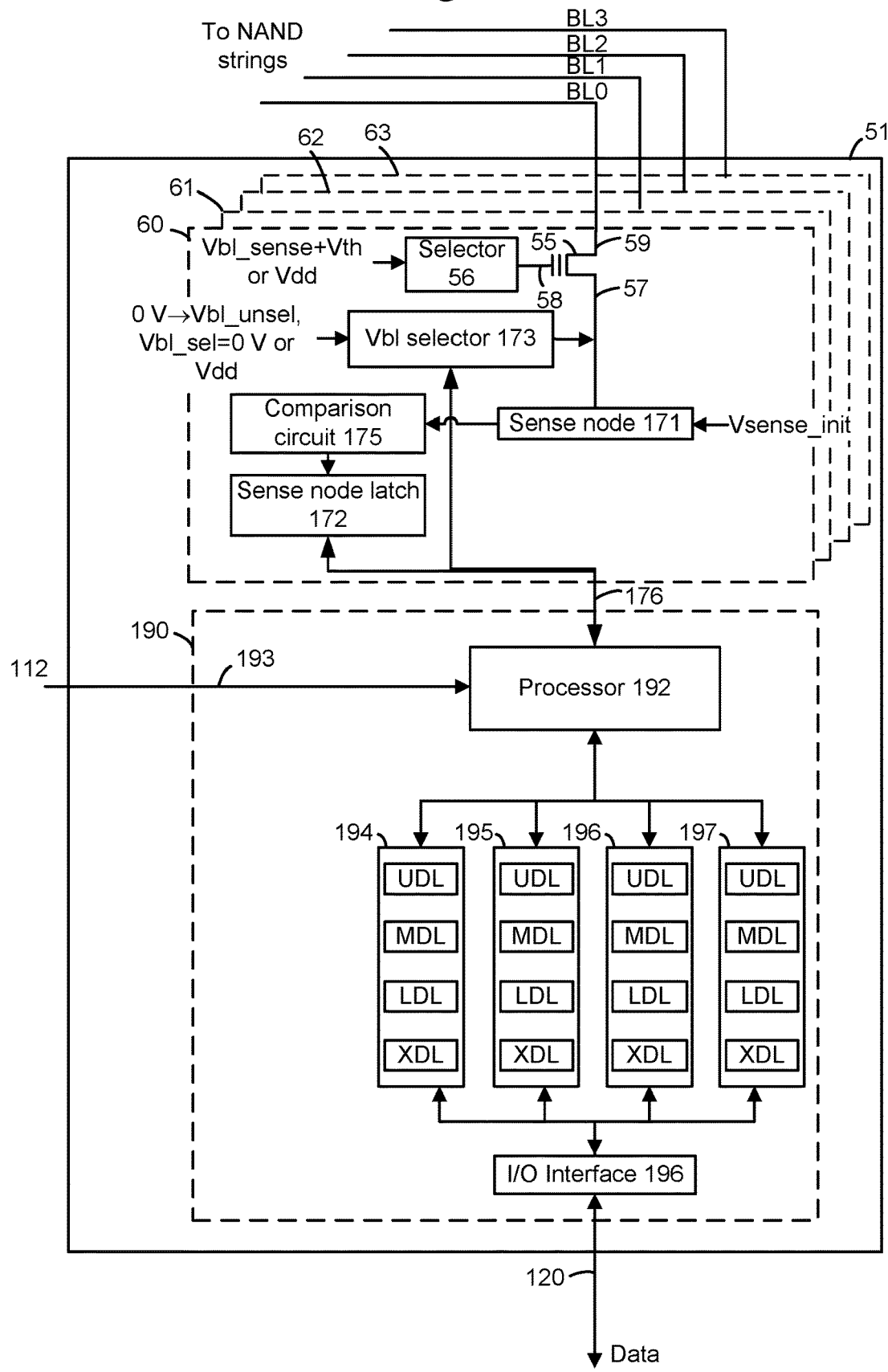
FIG. 2 is a block diagram depicting one embodiment of a sense block 51 in the read/write circuits 128 of FIG. 1.

FIG. 2 is a block diagram depicting one embodiment of a sense block 51 in the read/write circuits 128 of FIG. 1. The sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming. A data transfer latch XDL may be used to communicate to and from the data latches.

Figure 3A:
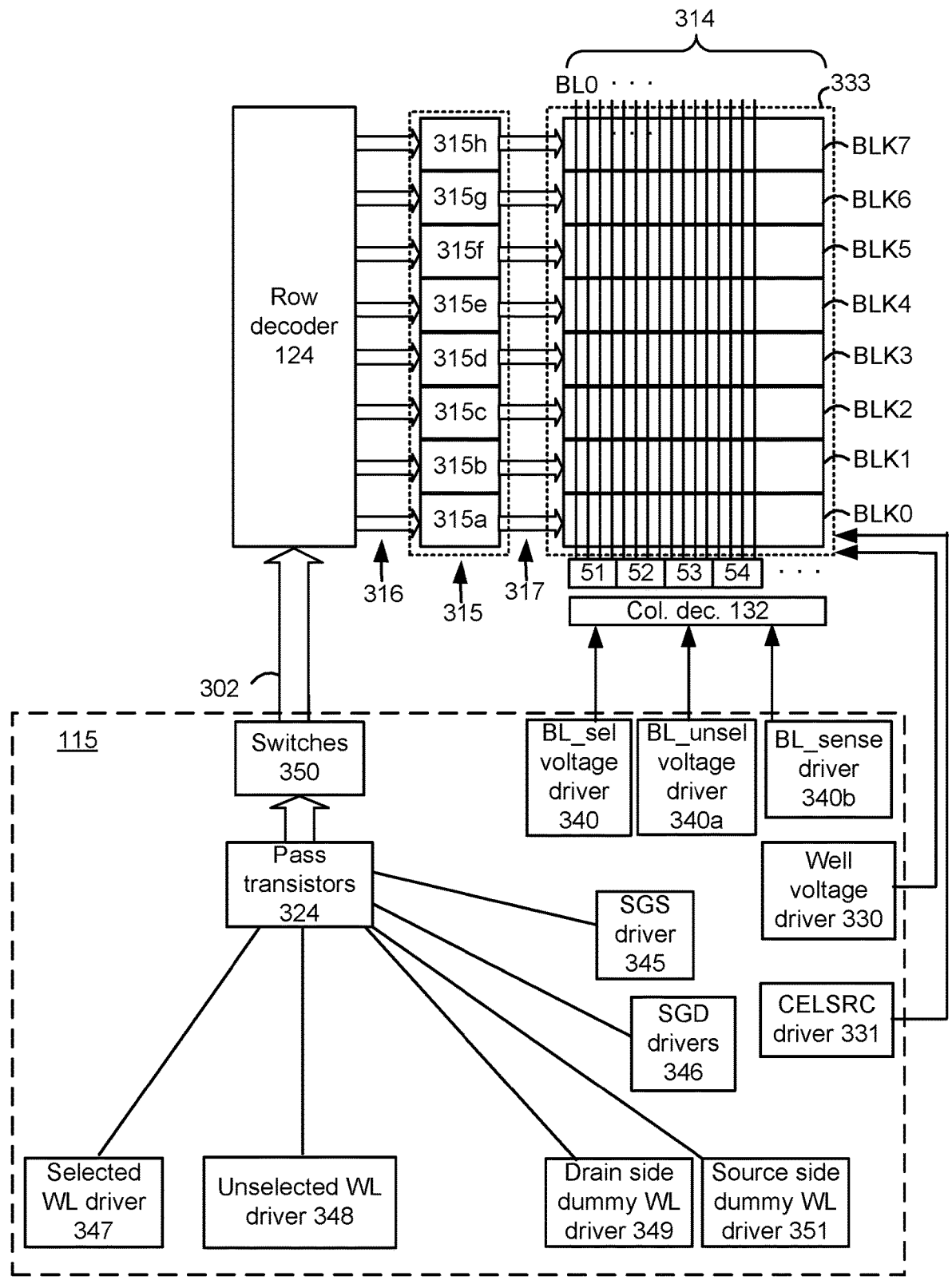
FIG. 3A depicts an example implementation of the power control circuit 115 of FIG. 1 for providing voltages to blocks of memory cells, where the blocks are arranged one after the other.

FIG. 3A depicts an example implementation of the power control circuit 115 of FIG. 1 for providing voltages to blocks of memory cells, where the blocks are arranged one after the other. The circuitry shown can be repeated for each plane of a die, in one approach. In this example, the memory structure 126 includes a set of eight blocks, BLK0-BLK7 on a plane 333 of a substrate, consistent with FIG. 4. Generally, the blocks can be in one or more planes. A row decoder 124 provide voltages to word lines and select gate control lines of each block via sets of word line voltage switching transistors 315 (pass transistors). In one approach, a separate row decoder is provided for each block. The row decoder provides a control signal on the conductive paths 316 to the word line voltage switching transistors which connect the row decoder to the word lines and select gate lines via the conductive paths 317. In one approach, the word line voltage switching transistors of each block are controlled by a common control gate voltage. Thus, the word line voltage switching transistors for a block are either all on (conductive) or off (non-conductive) at a given time. If the word line voltage switching transistors are on, a voltage from the row decoder is provided to the respective control gate lines and word lines of the block. If the word line voltage switching transistors are off, the row decoder is disconnected from the respective control gate lines or word lines so that the voltage floats on the respective control gate lines and word lines.

For instance, a block enable signal can be connected to each set of word line voltage switching transistors 315a-315h, which in turn are connected to select gate lines and word lines of BLK0-BLK7, respectively.

The row decoder can connect global control lines 302 to the conductive paths 316. Voltages are provided on the global control lines from a number of voltage drivers. Some of the voltage drivers may provide voltages to switches 350 which connect to the global control lines. Word line voltage switching transistors 324 are controlled to pass voltages from the voltage drivers to the switches 350.

A number of voltage drivers can be provided that are connected to the word line voltage switching transistors. For example, a selected data word line driver 347 provides a voltage signal on a data word line which is selected during a program or read operation. An unselected word line driver 348 provides a common voltage signal on each of the unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The drain side dummy word line driver 349 provides a voltage signal on WLDD, and the source side dummy word line driver 351 provides a voltage signal on WLDS.

The voltage drivers can also include a SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include SGD drivers 346 for different groups of SGD transistors of a block. The SGD drivers provide a voltage to a control line connected to the control gates of a SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+contact 612b in the p-well region 612, e.g., via the conductive path 682. See FIG. 6. In one approach, the p-well region 612 is common to a set of blocks on a plane. A set of bit lines 314 is also shared by the blocks. The bit lines may be driven by the column decoder 132 and connected to sense blocks 51, 52, 53, 54 . . . . A source line voltage driver, referred to as a CELSRC driver 331, provides a voltage Vcelsrc to a source end of a NAND string. For example, Vcelsrc can be provided to the n+contact 612c in the p-well region 612, e.g., via the local interconnect 651 (source line) in FIG. 6.

Bit line voltage drivers include voltage sources which provide voltages to the bit lines 314. BL_sel driver 340 is for selected bit lines in an operation, BL_unsel driver 340a is for unselected bit lines in an operation, and BL_sense driver 340b is for bit line involved in sensing.

Figure 3B:
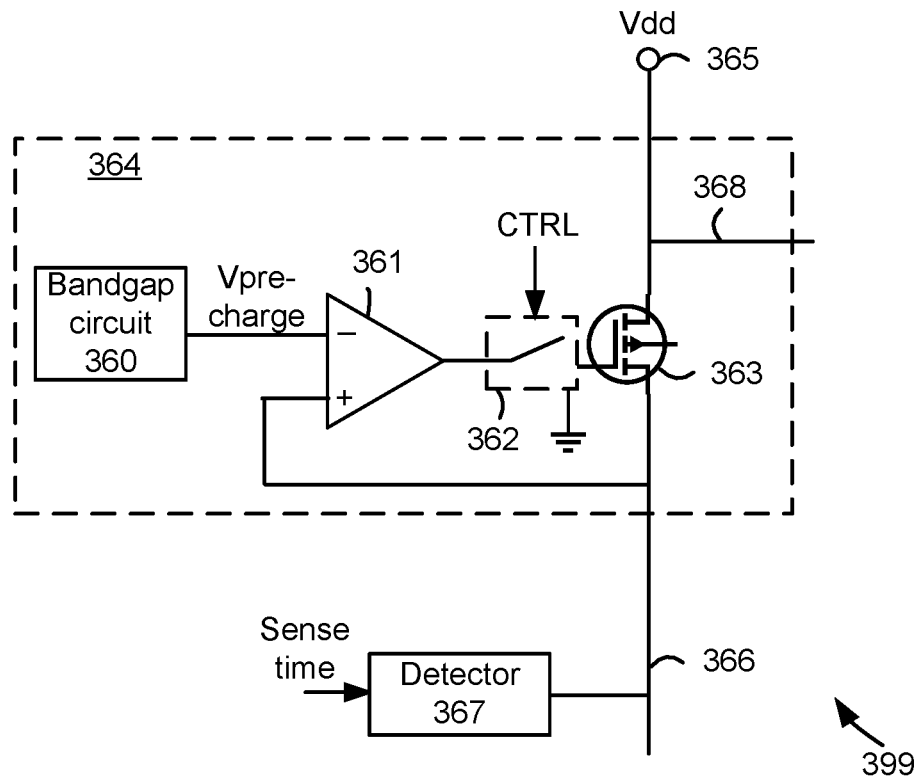
FIG. 3B depicts an example implementation of a circuit 399 in each of the sense circuits 60-63 of FIG. 2 for pre-charging bit lines and detecting a discharge voltage of the bit lines in a process for detecting a short circuit or an open circuit.

FIG. 3B depicts an example implementation of a circuit 399 in the sense circuit 60 of FIG. 2 for pre-charging bit lines and detecting a discharge voltage of the bit lines in a process for detecting a short circuit or an open circuit. Such a circuit can be provided in each sense circuit for each bit line. The circuit includes a voltage regulator 364 in which a bandgap circuit 360 provides a reference pre-charge voltage, Vpre-charge, to an inverting input of a differential amplifier 361 such as an operational amplifier. The output of the differential amplifier is provided to a switch 362 which is conductive or non-conductive based on a control signal CTRL. When the switch is conductive, the output of the amplifier is provided to the control gate of a pMOSFET 363 (a switch), and a feedback path is created from the output of the amplifier to the non-inverting input of the amplifier. This regulates the output of the pMOSFET to Vpre-charge, the output of the bandgap circuit, on the output path 366.

When the switch 362 is non-conductive, a ground voltage is provided to the control gate of the pMOSFET 363. In this case, the pMOSFET passes Vdd from a node 365 to an output path 368, so that the regulation is bypassed.

A detector 367 is connected to the output path 366 to detect a voltage or current on the path at a sense time. In one approach, after the pre-charge is applied for a specified time period, it is terminated so that the output path 366 floats, and a hold time is implemented. The sense time is at the end of the hold time.

Moreover, after a defect such as a short circuit or open circuit is detected, the circuit 399 can be used to provide a voltage at the level of Vpre-charge or another level in a laser scanning process which detects the physical location of the defect, as discussed further below.

Figure 3C:
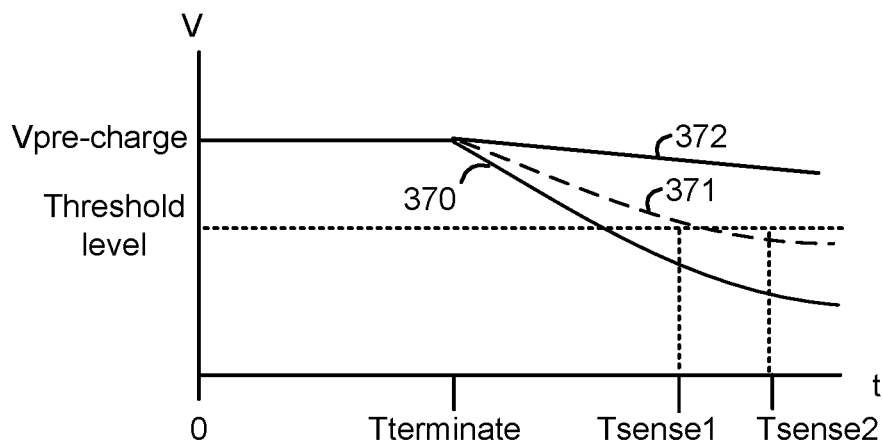
FIG. 3C depicts plots of voltages on the output path 366 of FIG. 3B showing pre-charging and discharging of a bit line, in a process for detecting a short circuit or an open circuit.

FIG. 3C depicts plots of voltages on the output path 366 of FIG. 3B showing pre-charging and discharging of a bit line, in a process for detecting a short circuit or an open circuit. The bit line is initially pre-charged to a level Vpre-charge at time=0. The bit line voltage remains at Vpre-charge until a time=Tterminate, when the pre-charge is terminated. The bit line voltage gradually discharges. If the bit line is short circuited to a ground path, it will discharge more quickly than when there is no such short circuit. The voltage is evaluated at t=Tsense1 and/or Tsense2 by the detector 367 to determine whether it is below a threshold level.

The different sense times may be used to distinguish a short circuit of the memory die from a short circuit of the control die. A short circuit in the memory die will take more time to discharge than a short circuit in the control die. This is due to the larger RC time constant of the discharge from the bit lines of the memory die to a ground node on the control die, through bit lines of the control die and vias which connect the two die.

If a sense circuit detects a discharge below the threshold level at Tsense1, as with plot 370, it is concluded that there is a short circuit of the bit line in the control die.

If a sense circuit does not detect a discharge below the threshold level at Tsense1, such as with plots 371 and 372, a further detection of the discharge is made at Tsense2. Tsense1 is a lesser sense time and Tsense2 is a greater sense time. If the discharge at Tsense2 is also not below the threshold, as with plot 372, it is concluded that there is no short circuit of the associated bit lines in the control die and the memory die. If the discharge at Tsense2 is below the threshold, but above the threshold at Tsense1, as with plot 371, it is concluded that there is a short circuit of the associated bit line in the memory die.

Similarly, in a test for an open circuit, the plot 372 denotes an open circuit since the discharge is above the threshold at either sense time and the plots 370 or 371 denotes no open circuit since the discharge is below the threshold at Tsense1 or Tsense2, respectively.

Figure 4:
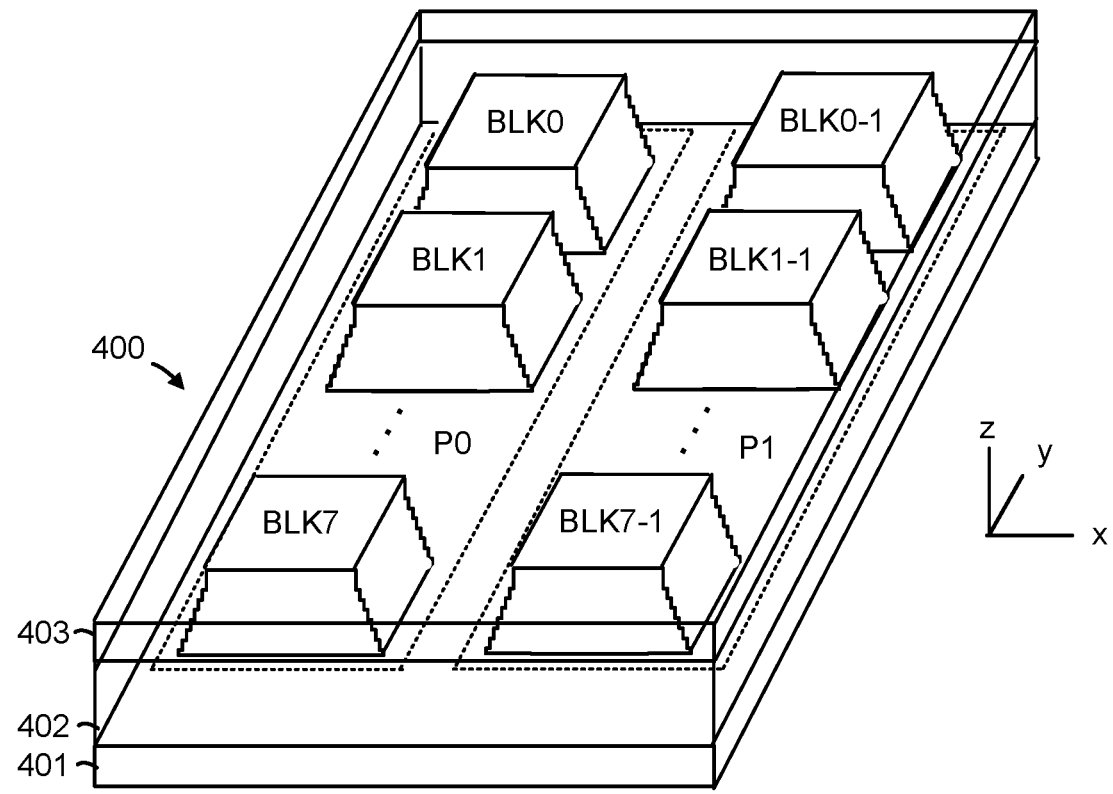
FIG. 4 is a perspective view of an example memory die 400 in which blocks are arranged one after another in respective planes P0 and P1, consistent with FIG. 3A.

FIG. 4 is a perspective view of an example memory die 400 in which blocks are arranged one after another in respective planes P0 and P1, consistent with FIG. 3A. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first set of blocks BLK0-BLK7 is formed in P0, and a second set of blocks BLK0-1 to BLK7-1 is formed in P1.

By providing blocks of memory cells in multiple planes, parallel operations can be performed in the planes. For example, blocks in a different planes can be erased concurrently.

The substrate 401 can have one or more lower metal layers which are patterned in conductive paths to carry signals of the circuitry such as to the control die.

Figure 6:
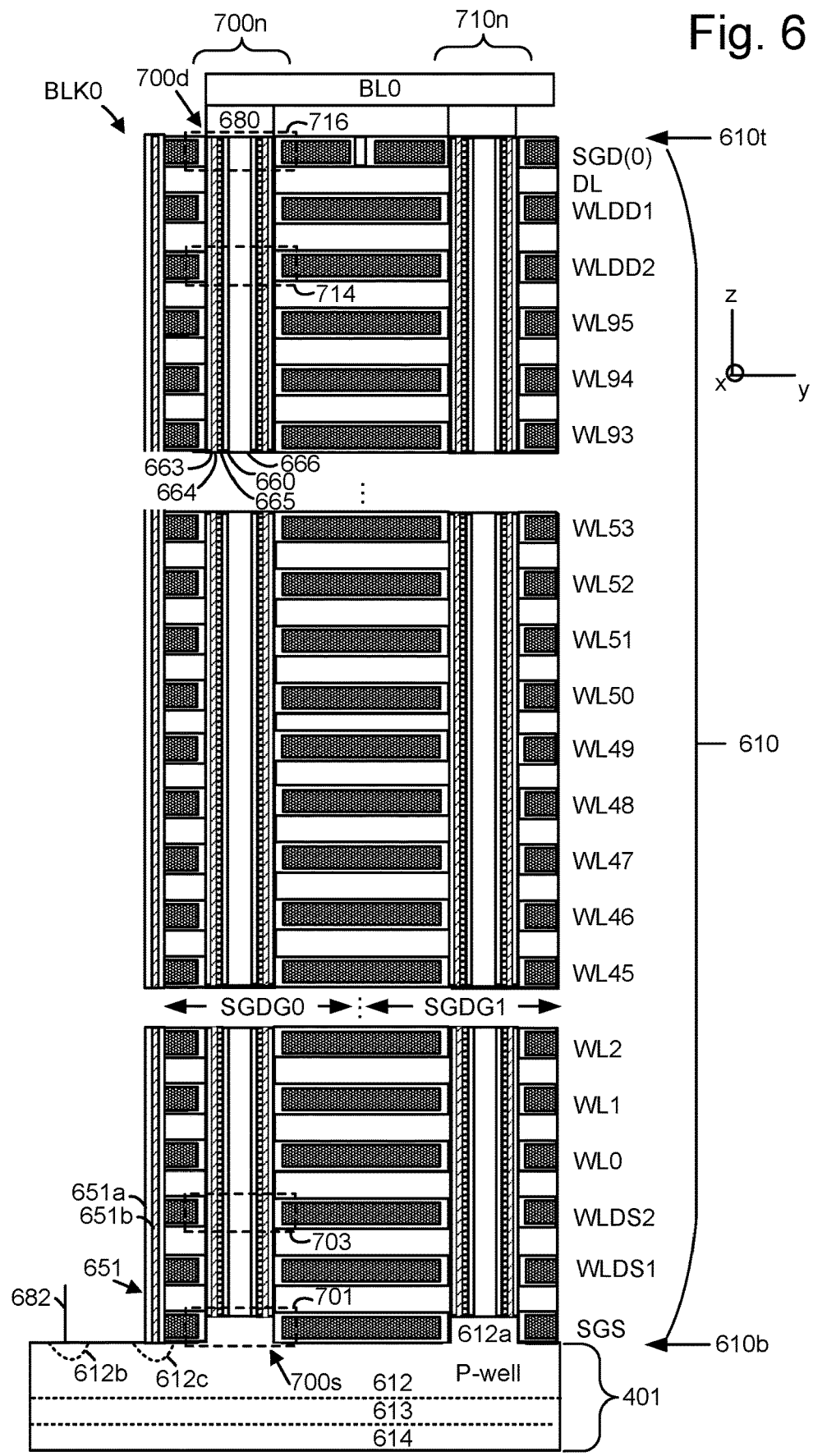
FIG. 6 depicts an example cross-sectional view of a portion of the block BLK0 of FIG. 4, including NAND strings 700n and 710n, in a single-tier stack.

In this example, the memory cells are formed in vertical NAND strings in the blocks, consistent with FIG. 6. Each block comprises a stacked area of memory cells, where alternating levels of the stack represent word lines. In one possible approach, each block has opposing tiered sides in a staircase shape from which vertical contacts extend upward to an upper metal layer to form connections to conductive paths. While two planes are depicted as an example, other examples can use four or more planes. One plane per die is also possible.

Figure 5:
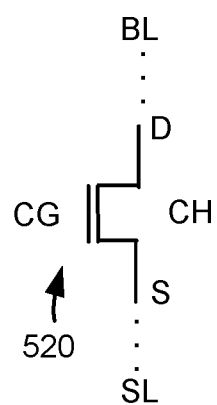
FIG. 5 depicts an example transistor 520 in the memory structure 126 of FIG. 1.

FIG. 5 depicts an example transistor 520 in the memory structure 126 of FIG. 1. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

FIG. 6 depicts an example cross-sectional view of a portion of the block BLK0 of FIG. 4, including NAND strings 700n and 710n, in a single-tier stack. In this example, the NAND strings 700n and 710n are in different SGD groups SGDG0 and SGDG1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. More WL layers, or fewer WL layers, can also be used in this technology for variations. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 612 connected to the source ends of the NAND strings. The p-well region may comprise epitaxial regions 612a which extend upward adjacent to the source-side select gate transistors. The p-well region can include an n+contact 612c connected to a local interconnect 651 for receiving a source line voltage, and a p+contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651. For floating gate NAND memory, this causes the electrons to return to the channel from the charge trapping layer. For charge trapping NAND memory, hole injection during an erase operation neutralizes the electrons.

In this example, the SGS transistors do not include the multiple thin layers 660, 663, 664 and 665.

Figure 7:
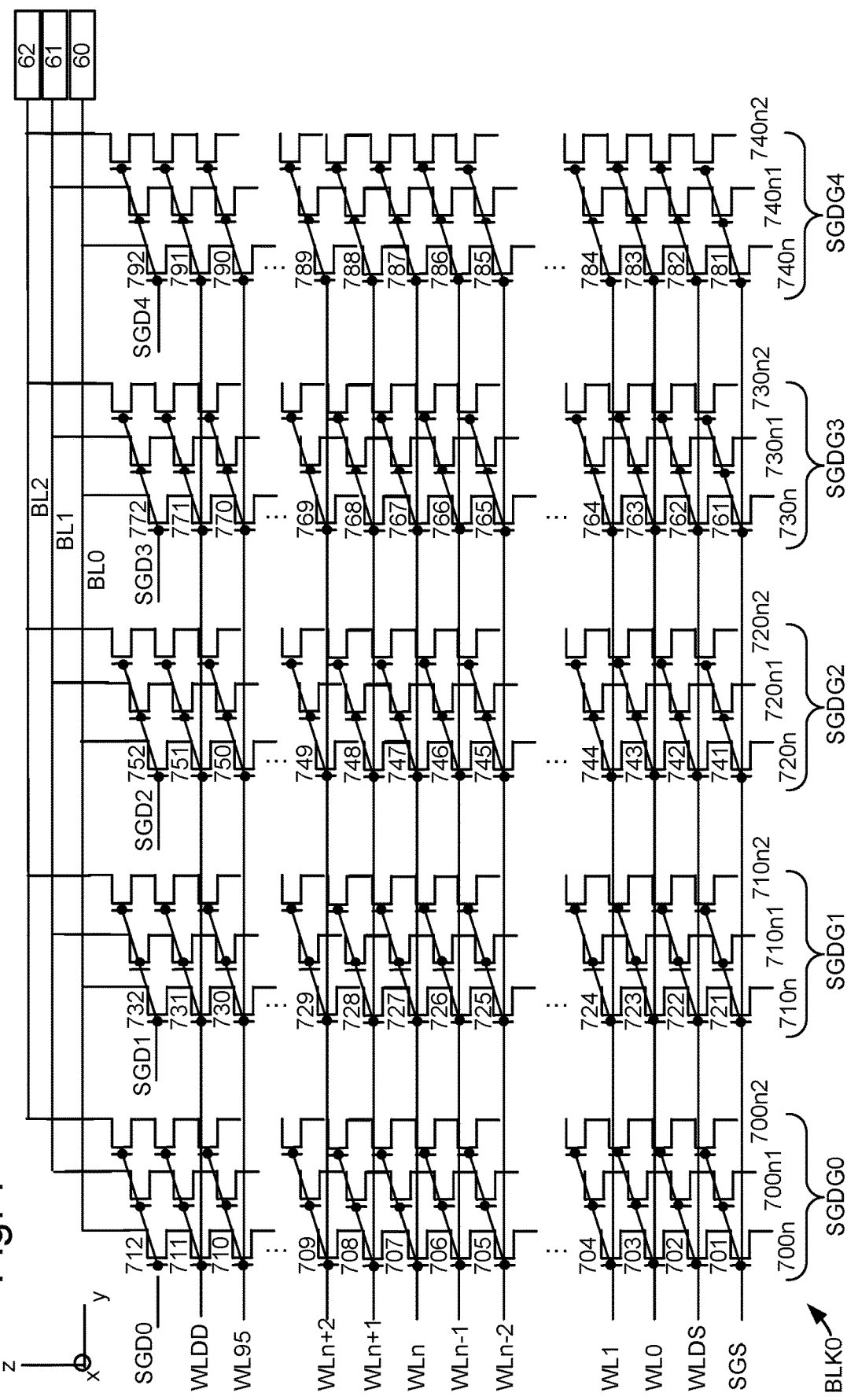
FIG. 7 depicts an example view of the block BLK0 of FIG. 4, with respective NAND strings arranged in SGD groups SGDG0-SGDG4, along with associated bit lines and sense circuits, consistent with FIG. 2.

FIG. 7 depicts an example view of the block BLK0 of FIG. 4, with respective NAND strings arranged in SGD groups SGDG0-SGDG4, along with associated bit lines and sense circuits, consistent with FIG. 2.

The set of word lines WL0-WL95 are connected to memory cells arranged in NAND strings. The NAND strings are arranged in select gate or SGD groups of the block in a 3D or vertical configuration. The block is consistent with FIG. 6. Each SGD group includes multiple NAND strings. Three example NAND strings are depicted, as a simplification. For example, SGDG0 comprises NAND strings 700n, 700n1 and 700n2, SGDG1 comprises NAND strings 710n, 710n1 and 710n2, SGDG2 comprises NAND strings 720n, 720n1 and 720n2, SGDG3 comprises NAND strings 730n, 730n1 and 730n2 and SGDG4 comprises NAND strings 740n, 740n1 and 740n2. The NAND strings have data word lines, dummy word lines and select gate lines. Each sub-block comprises a set of NAND strings which extend in the x direction and which have a common SGD line or control gate layer. In particular, the SGD lines or layers SGD0-SGD4 are in the select gate groups SGDG0-SGDG4, respectively.

Programming of the block may occur based on a word line programming order. One option is to program the memory cells in different portions of a word line which are in the different SGD groups, one group at a time, before programming the memory cells of the next word line. For example, this can involve programming WL0 in SGDG0, SGDG1, SGDG2, SGDG3 and then SGDG4, then programming WL1 in SGDG0, SGDG1, SGDG2, SGDG3 and then SGDG4, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected SGD group. Reading can occur one SGD group at a time.

In an erase operation, typically the entire block is erased, although a partial block erase is also possible. In one approach, an erase-verify test is performed for the entire block. In another approach, an erase-verify test is performed for one SGD group in a block.

Each NAND string comprises a plurality of memory cells between a SGS transistor and a SGD transistor, in this example. In other examples, more than one SGD and/or SGS transistor can be provided for each NAND string. The number of dummy memory cells can also vary. For example, the NAND string 700n includes a SGS transistor 701, a dummy memory cell 702, data memory cells 703-710, a dummy memory cell 711 and a SGD transistor 712. The NAND string 710n includes a SGS transistor 721, a dummy memory cell 722, data memory cells 723-730, a dummy memory cell 731 and a SGD transistor 732. The NAND string 720n includes a SGS transistor 741, a dummy memory cell 742, data memory cells 743-750, a dummy memory cell 751 and a SGD transistor 752. The NAND string 730n includes a SGS transistor 761, a dummy memory cell 762, data memory cells 763-770, a dummy memory cell 771 and a SGD transistor 772. The NAND string 740n includes a SGS transistor 781, a dummy memory cell 782, data memory cells 783-790, a dummy memory cell 791 and a SGD transistor 792.

This example depicts one SGD transistor at the drain end of each NAND string, and one SGS transistor at the source end of each NAND string. The SGD transistors in SGDG0-SGDG4 may be driven by separate control lines SGD0-SGD4, respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n, 730n and 740n in SGDG0-SGDG4, respectively, BL1 is connected to NAND strings 700n1, 710n1, 720n1, 730n1 and 740n1 in SGDG0-SGDG4, respectively, and BL2 is connected to NAND strings 700n2, 710n2, 720n2, 730n2 and 740n2 in SGDG0-SGDG4, respectively. Each bit line is also connected to a respective sense circuit, consistent with the sense circuits of FIG. 2. For example, BL0-BL2 are connected to sense circuits 60-62, respectively.

FIG. 8 depicts threshold voltage (Vth) distributions for an eight-state memory device. Eight data states, or three bits per cell, are depicted as an example. The techniques herein can apply to other modes, including one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution of plot 800 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state, as represented by Vth distribution 800a, and are not programmed. Most of the memory cells are programmed to higher states, such as A-F, in this example, as represented by Vth distributions 801-807, respectively. These memory cells are subject to verify tests using verify voltages of VvA-VvG.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG.

Figure 9A:
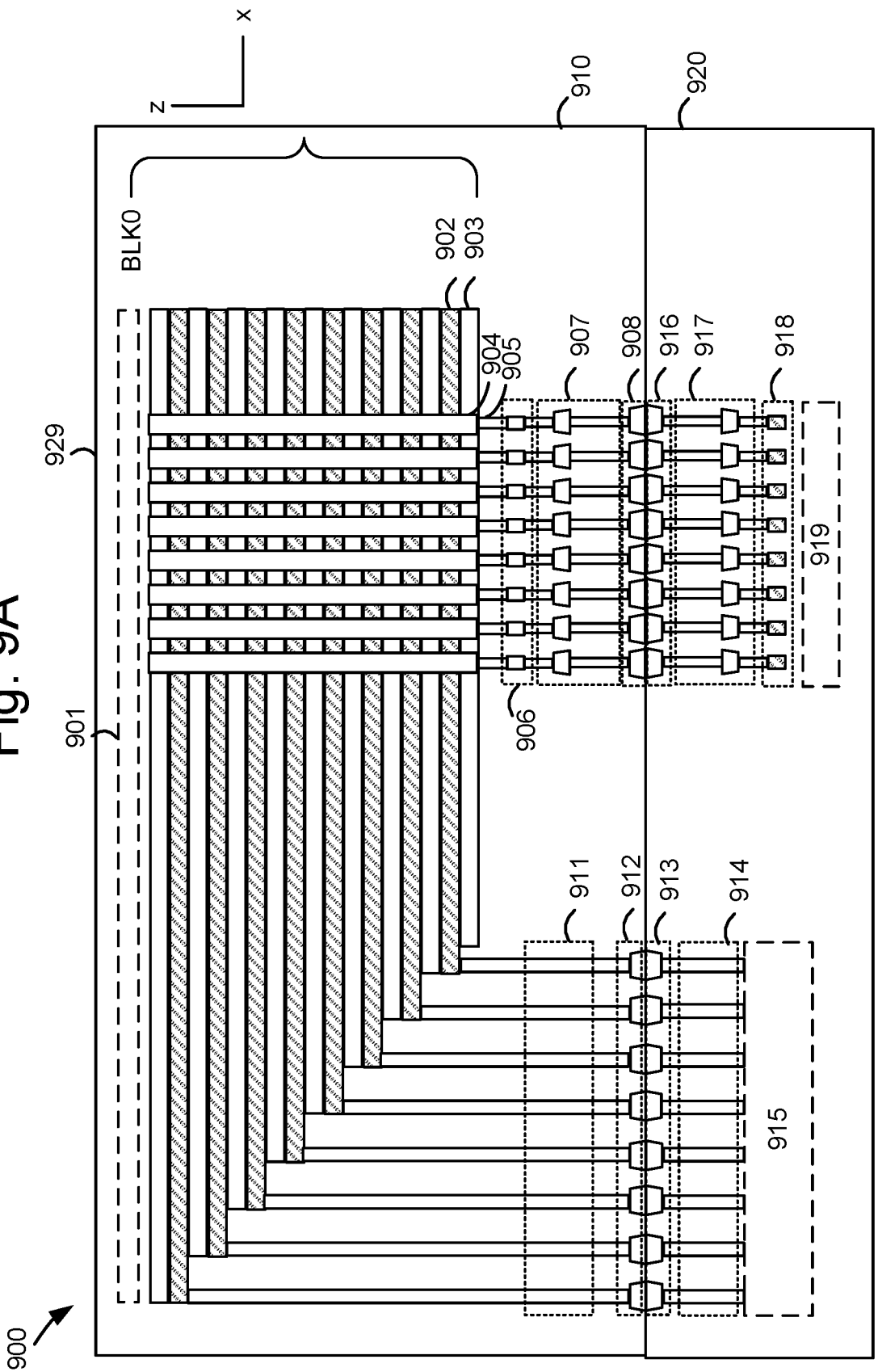
FIG. 9A depicts a cross-sectional view of a portion of the memory device 900 of FIG. 1, where the memory die 910 is inverted and bonded to the control die 920, the memory die and the control die have corresponding sets of bit lines, and the memory die 910 comprises a memory block BLK0 consistent with FIGS. 6 and 7.

FIG. 9A depicts a cross-sectional view of a portion of the memory device 900 of FIG. 1, where the memory die 910 is inverted and bonded to the control die 920, the memory die and the control die have corresponding sets of bit lines, and the memory die 910 comprises a memory block BLK0 consistent with FIGS. 6 and 7. A p-well region 901 is above the block since the memory die is inverted relative to the orientation in which it was fabricated. A backside 929 of the memory die faces up in this configuration. BLK0 includes alternating conductive and dielectric layers, including an example conductive layer 902 and an example dielectric layer 903. A staircase pattern is formed at the end of the block to provide conductive paths for the word lines. In particular, the conductive paths 911 in the memory die are connected to bond pads 912 at a face of the memory die. These bond pads in turn are connected to bond pads 913 on the control die. The bond pads 913 may be connected to circuitry 915 such as word line switching transistors by conductive paths 914. A space between the dies may be filled with an epoxy or other resin or polymer.

The NAND strings in the block are connected to a set of bit lines 906. For example, a NAND string 904 is connected to a bit line by a via 905. The bit lines in turn are connected to bond pads 908 by conductive paths 907.

The control die 920 includes a set of bit lines 918 which correspond to the set of bit lines 906 of the memory die. That is, the two sets have the same number of bit lines. The bit lines are elongated conductive paths which extend over a set of blocks in a plane, such as depicted in FIG. 3A. The set of bit lines 918 are connected by conductive paths 917 to bond pads 916 at a face of the control die. The bond pads 916 and 908 are connected to provide conductive paths between the two sets of bit lines. Circuitry 919 can include sense circuits connected to the set of bit lines 918. Generally, the conductive paths between the bit lines and the bond pads in the memory die and the control die involve a relatively large amount of metal in multiple metallization layers. This can interfere with laser imaging of the bit lines in the control die. However, the defect detection techniques provided herein overcome this problem.

In one approach, a plurality of blocks of memory cells are arranged on a first die; and the sets of word line switching transistors are arranged on a second die connected to the first die at bond pads of the first and second die.

Figure 9B:
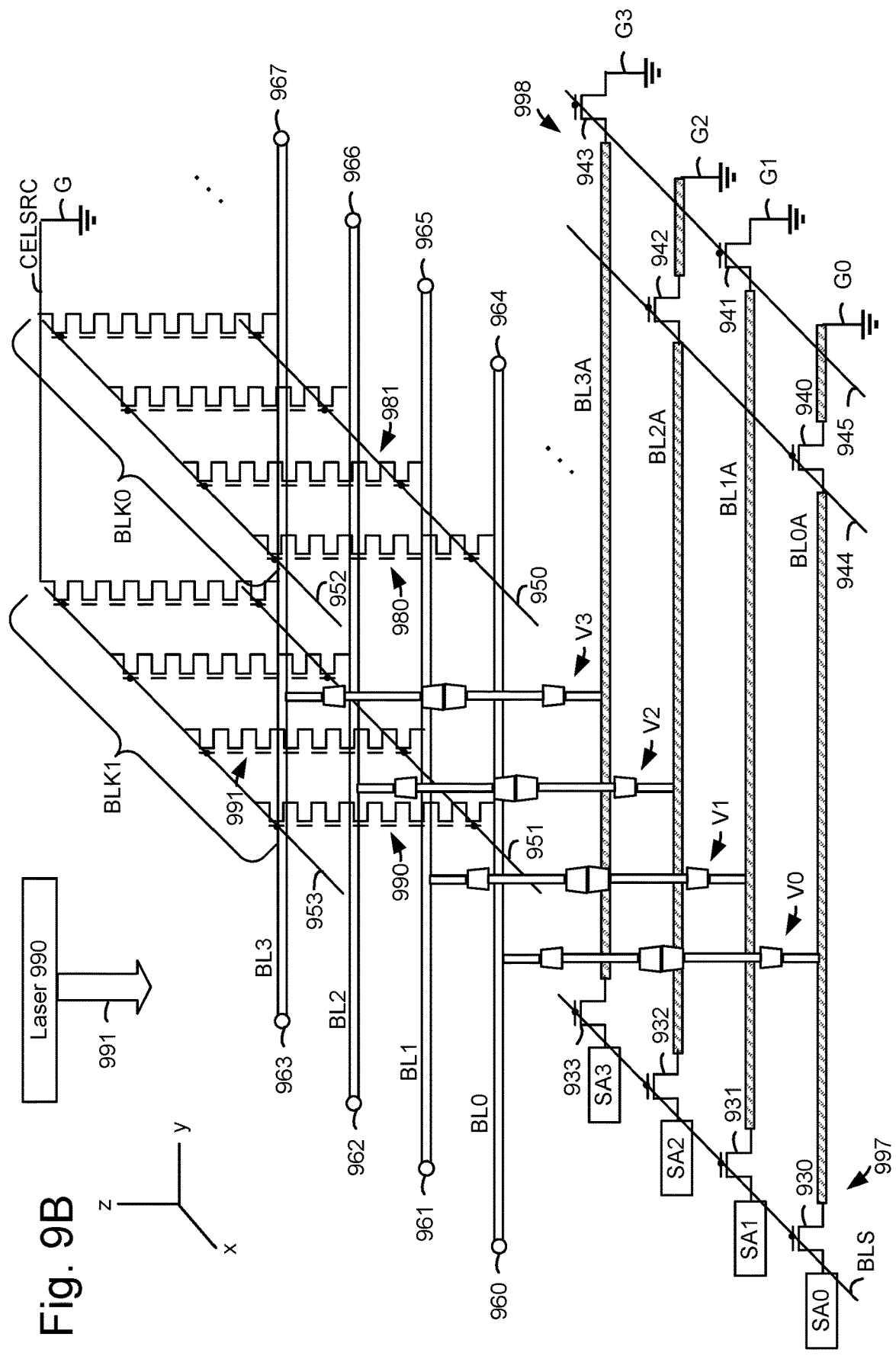
FIG. 9B depicts a view of the bit lines of the memory die and control die of FIG. 9A, where ground transistors are connected to the bit lines of the control die to provide ground paths for detecting a short circuit or an open circuit.

FIG. 9B depicts a view of the bit lines of the memory die and control die of FIG. 9A, where ground transistors are connected to the bit lines of the control die to provide ground paths for detecting a short circuit or an open circuit. Four bit lines in each die are depicted in a simplified example. The memory die includes bit lines BL0-BL3 and the control die includes bit lines BL0A-BL3A. The bit lines on the control die extend parallel to the bit lines on the memory die. Additionally, the length of the bit lines on the control die are similar to the length of the bit lines on the memory die, e.g., within +/−20%. This helps equalize a capacitance between the bit lines of the two dies.

Each bit line in the control die is connected to a corresponding bit line in the memory die by a respective via. For example, BL0A-BL3A are connected to BL0-BL3, respectively, by vias V0-V3, respectively. Each bit line in the control die is also connected at one end to a corresponding sense circuit such as sense amps SA0-SA3 for BL0A-BL3A, respectively. The sense amps are sense circuits which are connected to another end 997 of the set of bit lines of the control die A transistor 930-933 can connect or disconnect SA0-SA3, respectively, to/from BL0A-BL3A, respectively. When a transistor is turned on, the corresponding sense amp can apply a pre-charge voltage to the corresponding bit line. To terminate the pre-charge, the transistor is turned off. The control gates of the transistors 930-933 can be connected to a common path BLS so that they are turned on or off together.

Each bit line in the control die is also connected at another end, opposite the end connected to the sense circuit, to a grounding transistor. For example, BL0A-BL3A are connected to ground transistors 940-943 which in turn are connected to ground nodes G0-G3. The set of ground transistors 940-943 are connected to one end 998 of the set of bit lines BL0A-BL3A of the control die. These ground nodes are shown as being separate but may represent a common ground node. The ground transistors can be turned on (made conductive) to connect the bit lines to the ground node, or turned off (made non-conductive) to disconnect the bit lines from the ground node. The ground transistors of even-numbered bit lines (e.g., 940 and 942 for BL0A and BL2A, respectively) can be connected to a common path 944 so that they are turned on or off together, while the ground transistors of odd-numbered bit lines (e.g., 941 and 943 for BL1A and BL3A, respectively) can be connected to another common path 945 so that they are turned on or off together. The ground transistors of even-numbered bit lines are even-numbered ground transistors and the ground transistors of odd-numbered bit lines are odd-numbered ground transistors.

The presence of the ground transistors on the set of bit lines of the control die allows for various defect detection processes as described herein.

In the memory die, the bit lines are terminated at opposing ends so that the bit lines float. For example, a first end 960-963 and an opposing second end 964-967 are depicted for BL0-BL3, respectively. The bit lines are connected to NAND strings in a set of blocks such as BLK0-BLK7 in FIG. 3A. In this simplified example, two blocks, BLK0 and BLK1, are depicted in a simplified way. Representative NAND strings for these blocks are depicted, including NAND strings 980 and 981 for BLK0 and NAND strings 990 and 991 for BLK1. The SGD transistors of the NAND strings in BLK0 and BLK1 are connected to control lines 950 and 951, respectively. The SGS transistors of the NAND strings in BLK0 and BLK1 are connected to control lines 952 and 953, respectively. In a block, the SGD transistors can be turned on to connect the NAND strings to respective bit lines, while the SGS transistors can be turned on to connect the NAND strings to a source line, CELSRC, which may be connected to a ground node G.

The NAND strings in a block can be turned on (made conductive) by turning on the SGD and SGS transistors and providing a word line voltage which is sufficiently high to provide the memory cells in a conductive state. When the NAND strings of a block are turned on, a conductive path is created between the bit lines of the memory die and the ground node G. This conductive path can allow for a discharge of the bit lines in a defect detection process.

The NAND strings in a block can be turned off (made non-conductive) by turning off the SGD and/or SGS transistors and/or providing a word line voltage which is sufficiently low to provide the memory cells in a non-conductive state. When the NAND strings of a block are turned off, a conductive path is not created between the bit lines of the memory die and the ground node G, so that discharge of the bit lines through the block is prevented.

The laser 990 directs a laser beam 991 to the memory device at the backside of the memory in a defect imaging technique such as OBIRCH.

Figure 9C:
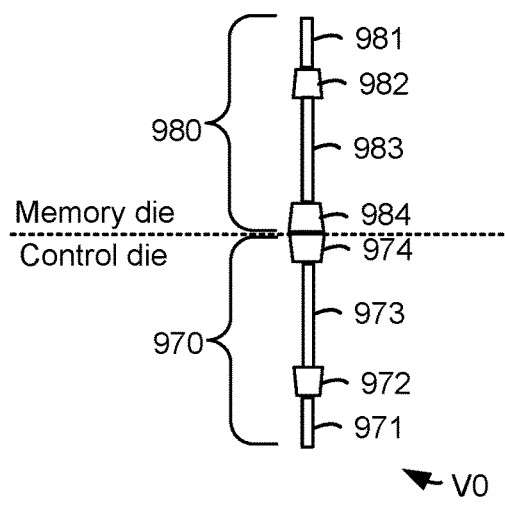
FIG. 9C depicts an example implementation of the via V0 of FIG. 9B.

FIG. 9C depicts an example implementation of the via V0 of FIG. 9B. The via includes a portion 970 in the control die, referred to as a control die via, and a portion 980 in the memory die, referred to as a memory die via. The control die via includes bond pads 972 and 974 and vias 971 and 973. The memory die via includes bond pads 982 and 984 and vias 981 and 983.

Figure 10A:
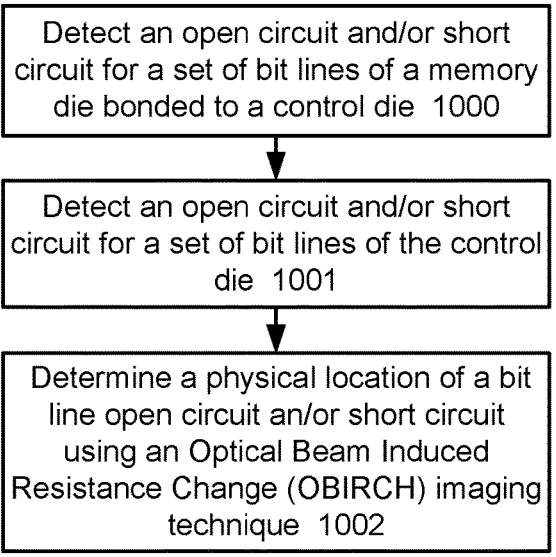
FIG. 10A is a flowchart of an example process for detecting a defect in bit lines on a memory die and a control die and detecting a physical location of the defect.

FIG. 10A is a flowchart of an example process for detecting a defect in bit lines on a memory die and a control die and detecting a physical location of the defect. Step 1000 includes detecting an open circuit and/or short circuit for a set of bit lines of a memory die bonded to a control die. Step 1001 includes detecting an open circuit and/or short circuit for a set of bit lines of the control die. Step 1002 includes determine a physical location of a bit line open circuit and/or short circuit using an Optical Beam Induced Resistance Change (OBIRCH) imaging technique.

If the ground transistors of the control die in FIG. 9B are not present, a ground path can be provided through the source line and the NAND strings of a memory block on the memory die. The memory blocks can be in an erased state. In this case, a bit line with an open circuit can be detected by using the sense amps to pre-charge the bit lines (to a level representing data 0), then determine whether the bit lines discharge through a selected block (which can be a furthest block from the sense amps). Good bit lines will discharge (to a level representing data 1) through the selected erased block. Failing open bit lines will remain charged and read as data 0. However, in this case, for global open bit lines, there is no way to distinguish whether the open circuit is on the memory die or the control die.

With the added ground transistors and ground nodes of the control die as described herein, this problem can be resolved. In an example process, all bit lines are pre-charged (data 0). All bit lines are then grounded at an end of the bit lines furthest from the sense amps which provide the pre-charge. All memory blocks are unselected so there is no discharge path through them. The bit lines are then sensed. Good bit lines will have a level of data 1, indicating they are discharged to ground. Failing bit lines on the control die will have a level 0, indicating they are not discharged and have an open circuit.

An open circuit test can also be performed for the bit lines of the memory array with all bit lines of the control die floating so there is no discharge path through them. In this case, the ground transistors are turned off. The erase blocks are read on the memory die. Added bit lines failing as data 0, which do not discharge, are due to defective bit lines on the memory die or perhaps an open bonding connection.

Furthermore, if the ground transistors of the control die are not present, short circuits between bit lines on the control die can be detected by using odd-vs. even bit line data patterns at the sense amps to pre-charge bit lines. The pre-charged bit lines are held at the pre-charge level for a hold time and then read at a sense time, such as depicted in FIG. 3C. Bit line with data 0 will discharge to data 1 if there is a short circuit to the neighbor data 1 bit line. This pattern is reversed and the results are combined. For two adjacent bit lines, the results are ANDed. If either is a data 0, the bit lines are non-defective. If both are a data 1, the bit lines are defective. However, in this case, there is no way to distinguish whether the short circuit is on the memory die or the control die.

With the added ground transistors and ground nodes of the control die as described herein, this problem can be resolved. In one approach, all even-numbered bit lines are pre-charged (data 0), and odd-numbered bit lines are grounded (data 1) through the ground transistors. The pre-charge is terminated, and a hold time is implemented. All memory blocks are unselected so there is no discharge path to the source line. The even-numbered bit lines are then sensed. Good bit lines will have data 0, indicting no significant discharge. Short-circuited bit lines will have data 1, indicating significant discharge.

The process is repeated for odd-numbered bit lines. The results are then combined. If either bit line of a pair of adjacent bit lines is a data 0, the bit lines are non-defective. If both are a data 1, the bit lines are defective.

The process can be repeated for several hold times. Short circuits between bit lines on the control die will result in a relatively fast discharge since there is a direct low resistance discharge path to the ground node of the control die. See FIG. 12D. On the other hand, short circuits between bit lines on the memory die will result in a relatively slow discharge since there is a longer discharge path to the ground node of the control die. See FIG. 12C.

Figure 10B:
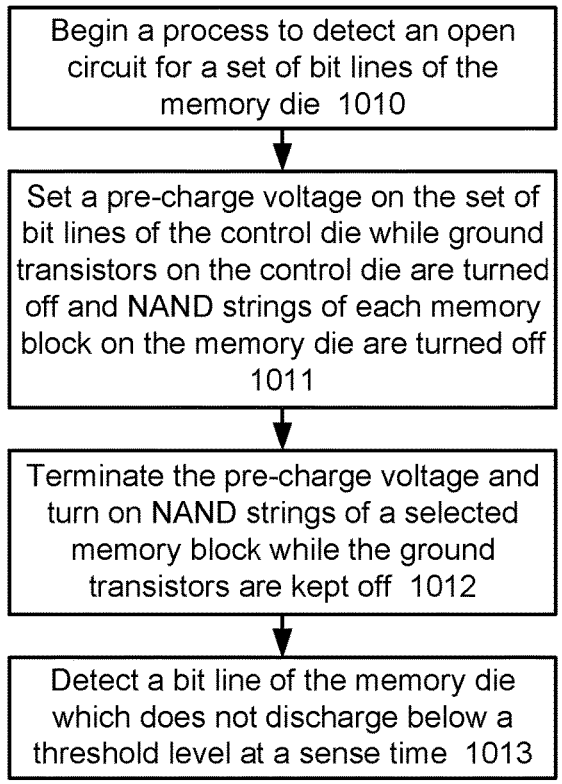
FIG. 10B is a flowchart of a process for detecting an open circuit for a set of bit lines of a memory die, consistent with step 1000 of FIG. 10A.

FIG. 10B is a flowchart of a process for detecting an open circuit for a set of bit lines of a memory die, consistent with step 1000 of FIG. 10A. Step 1010 includes beginning a process to detect an open circuit for a set of bit lines of the memory die. Step 1011 includes setting a pre-charge voltage on the set of bit lines of the control die while ground transistors on the control die are turned off and NAND strings of each memory block on the memory die are turned off. Since the bit lines of the control die and memory die are connected, the pre-charge voltage on the bit lines of the control die is also provided on the bit lines of the memory die in the absence of an open circuit.

Since the ground transistors on the control die are turned off and the NAND strings of each memory block on the memory die are turned off, the pre-charge voltage cannot discharge through the ground transistors or memory blocks, respectively.

Step 1012 includes terminating the pre-charge voltage and turning on NAND strings of a selected memory block while the ground transistors are turned off. Step 1013 includes detecting a bit line of the memory die which does not discharge below a threshold level at a sense time. See also FIGS. 3B and 3C. The sense circuit can perform the detection using the detector 367 of FIG. 3B. Since the bit lines of the control die and memory die are connected, the detection of a voltage on BL0A, for example, is equivalent to a detection of the voltage on BL0.

The bit line having the open circuit is identified as a defective bit line and may be noted for further analysis in the OBIRCH process.

See FIG. 12A for an example.

Figure 10C:
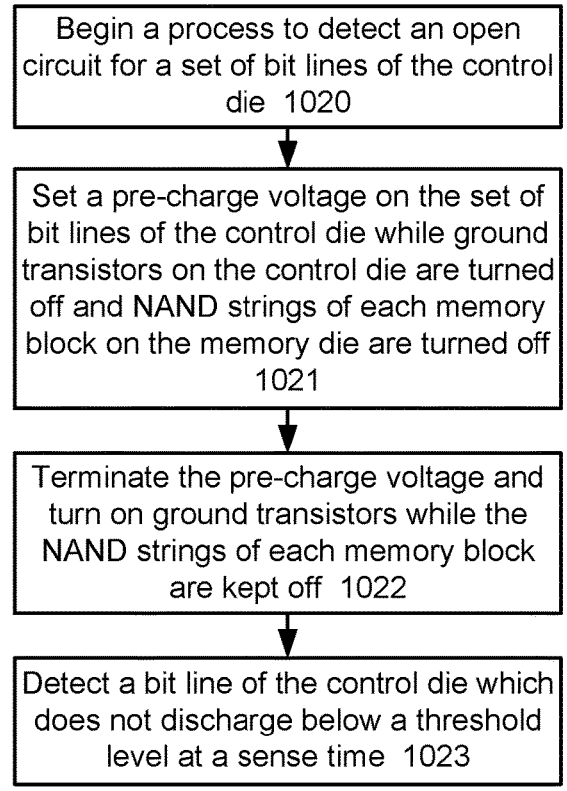
FIG. 10C is a flowchart of a process for detecting an open circuit for a set of bit lines of a control die, consistent with step 1001 of FIG. 10A.

FIG. 10C is a flowchart of a process for detecting an open circuit for a set of bit lines of a control die, consistent with step 1001 of FIG. 10A. Step 1020 begins a process to detect an open circuit for a set of bit lines of the control die. Step 1021 includes setting a pre-charge voltage on the set of bit lines of the control die while ground transistors on the control die are turned off and NAND strings of each memory block on the memory die are turned off. Step 1022 includes terminating the pre-charge voltage and turning on the ground transistors while the NAND strings of each memory block are turned off. Step 1023 includes detecting a bit line of the control die which does not discharge below a threshold level at a sense time.

Figure 12B:
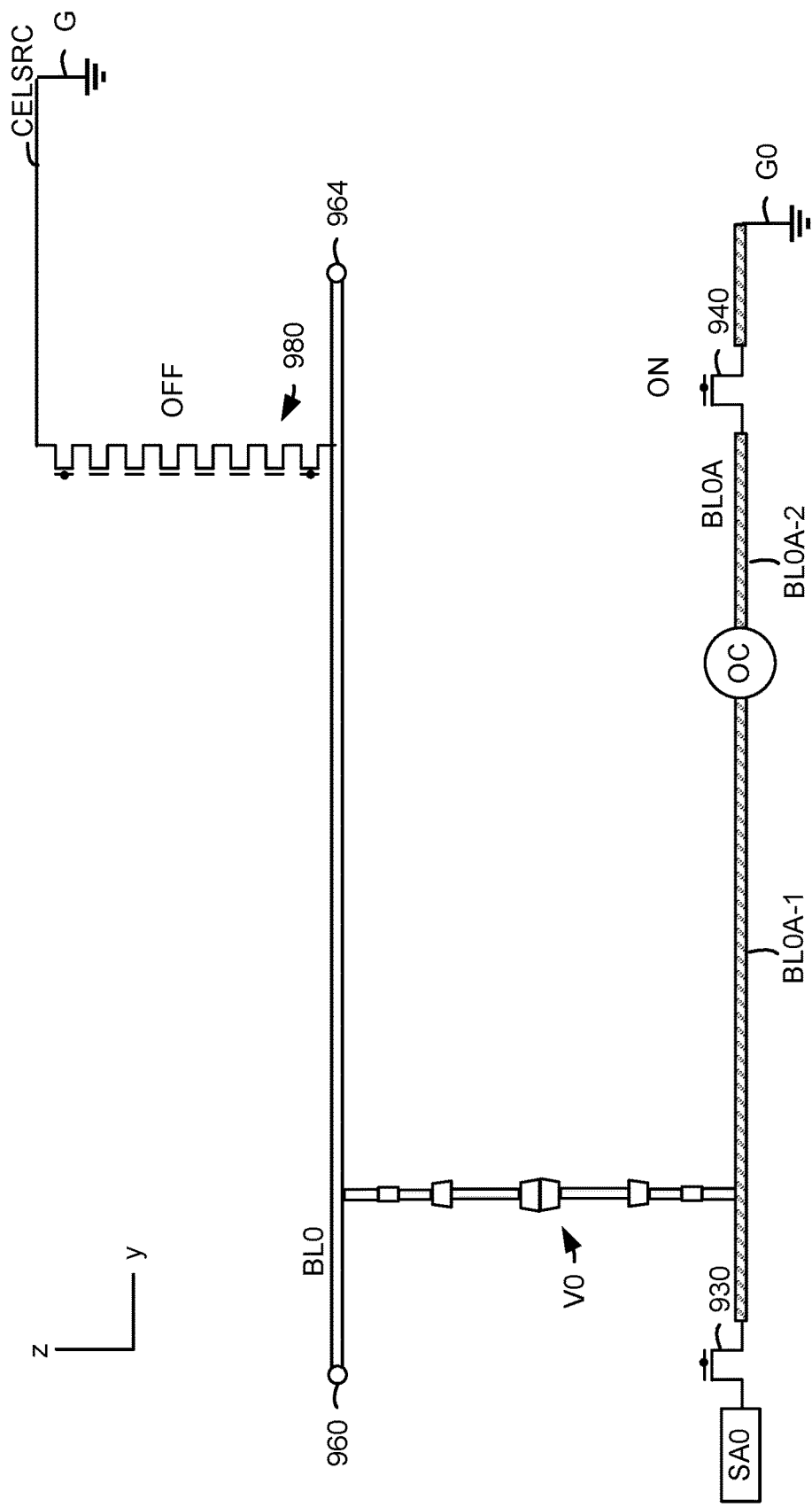
FIG. 12B depicts an example configuration of BL0 of the memory die and BL0A of the control die of FIG. 9B when detecting an open circuit in BL0A, consistent with FIG. 10C.

See FIG. 12B for an example.

Figure 10D:
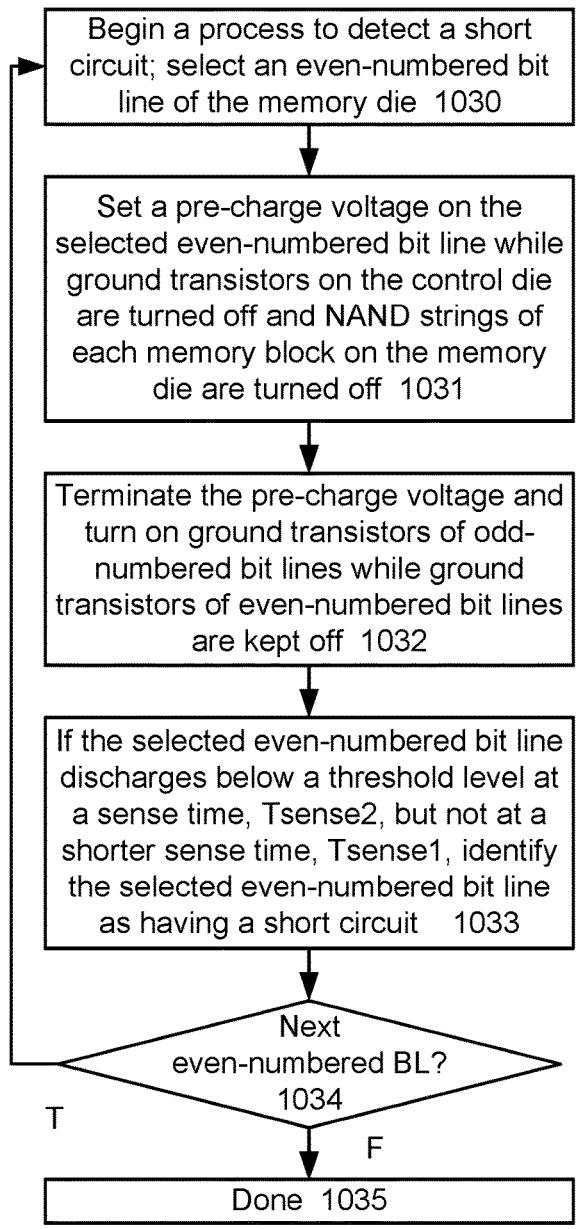
FIG. 10D is a flowchart of a process for detecting a short circuit for even-numbered bit lines of a memory die, consistent with step 1000 of FIG. 10A.

FIG. 10D is a flowchart of a process for detecting a short circuit for even-numbered bit lines of a memory die, consistent with step 1000 of FIG. 10A. Step 1030 includes beginning a process to detect a short circuit, including select an even-numbered bit line of the memory die. Step 1031 includes setting a pre-charge voltage on the selected even-numbered bit line while ground transistors on the control die are turned off and NAND strings of each memory block on the memory die are turned off. Since the even-numbered bit lines of the control die and memory die are connected, the pre-charge voltage on the selected even-numbered bit line of the control die is also provided on the corresponding even-numbered bit lines of the memory die in the absence of an open circuit.

Step 1032 includes terminating the pre-charge voltage and turning on ground transistors of odd-numbered bit lines while ground transistors of even-numbered bit lines are turned off.

Step 1033 includes, if the selected even-numbered bit line discharges below a threshold level at a sense time, Tsense2, but not at a shorter sense time, Tsense1, identifying the selected even-numbered bit line as having a short circuit. As mentioned, when a bit line in the memory die discharges through a via and a bit line in the control die, the discharge is over a relatively long conductive path with a relatively high RC time constant. The sense time should therefore be greater than for an analogous discharge directly from a bit line in the circuit node. A decision step 1034 determines whether there is a next even-numbered bit line (BL) to process. If the decision step is true (T), step 1030 is reached. If the decision step is false (F), the process is done at step 1035.

Figure 12C:
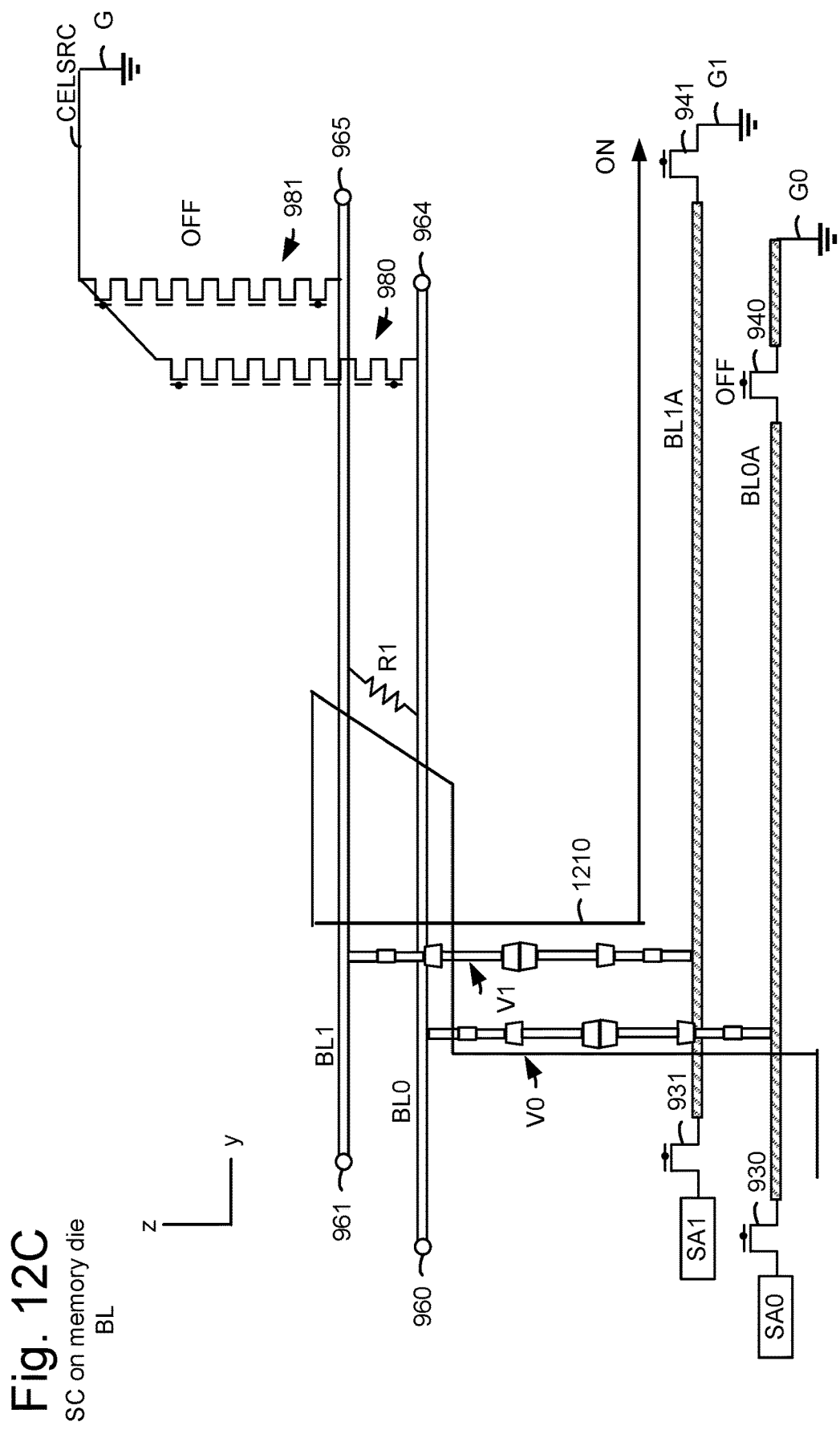
FIG. 12C depicts an example current path in BL0 and BL1 of the memory die and BL0A and BL1A of the control die of FIG. 9B when detecting a short circuit in the even-numbered bit line BL0 of the memory die, consistent with FIG. 10D.

See FIG. 12C for an example.

In another option, all of the even-numbered bit lines of the memory die are selected concurrently.

Figure 10E:
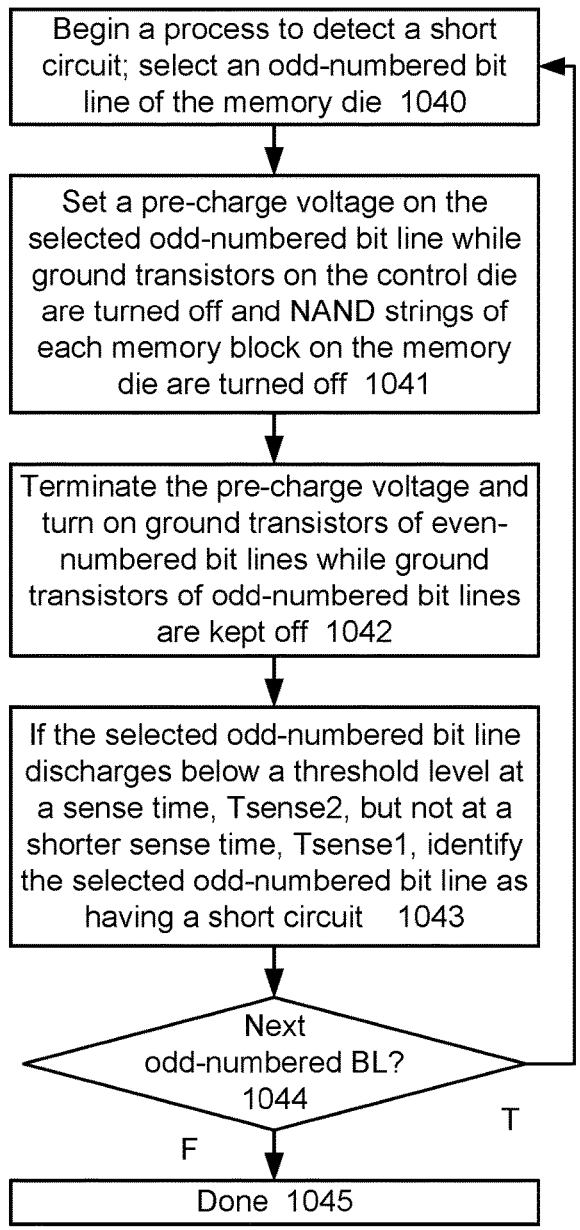
FIG. 10E is a flowchart of a process for detecting a short circuit for odd-numbered bit lines of a memory die, consistent with step 1000 of FIG. 10A.

FIG. 10E is a flowchart of a process for detecting a short circuit for odd-numbered bit lines of a memory die, consistent with step 1000 of FIG. 10A. The process for odd-numbered bit lines is analogous to the process for even-numbered bit lines of FIG. 10D. Step 1040 includes beginning a process to detect a short circuit, including selecting an odd-numbered bit lines of the memory die. Step 1041 includes setting a pre-charge voltage on the selected odd-numbered bit line while ground transistors on the control die are turned off and NAND strings of each memory block on the memory die are turned off. Since the odd-numbered bit lines of the control die and memory die are connected, the pre-charge voltage on the odd-numbered bit lines of the control die is also provided on the odd-numbered bit lines of the memory die in the absence of an open circuit.

Step 1042 includes terminating the pre-charge voltage and turning on ground transistors of even-numbered bit lines while ground transistors of odd-numbered bit lines are turned off.

Step 1043 includes, if the corresponding odd-numbered bit line discharges below a threshold level at a sense time, Tsense2, but not at a shorter sense time, Tsense1, identifying the selected odd-numbered bit line as having a short circuit. A decision step 1044 determines whether there is a next odd-numbered bit line (BL) to process. If the decision step is true, step 1040 is reached. If the decision step is false, the process is done at step 1045.

In another option, all of the odd-numbered bit lines of the memory die are selected concurrently.

Figure 10F:
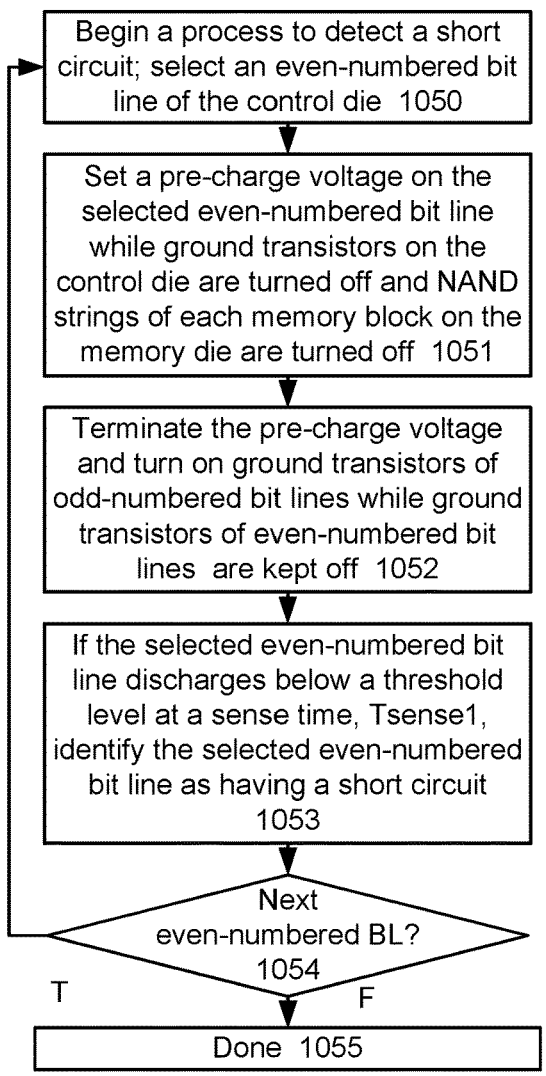
FIG. 10F is a flowchart of a process for detecting a short circuit for even-numbered bit lines of a control die, consistent with step 1001 of FIG. 10A.

FIG. 10F is a flowchart of a process for detecting a short circuit for even-numbered bit lines of a control die, consistent with step 1001 of FIG. 10A. Step 1050 includes beginning a process to detect a short circuit, including selecting an even-numbered bit line of the control die. Step 1051 includes setting a pre-charge voltage on the selected even-numbered bit line while ground transistors on the control die are turned off and NAND strings of each memory block on the memory die are turned off. Step 1052 includes terminating the pre-charge voltage and turning on ground transistors of odd-numbered bit lines while ground transistors of even-numbered bit lines are turned off. Step 1053 includes, if the selected even-numbered bit line discharges below a threshold level at a sense time, Tsense1, identifying the selected even-numbered bit line as having a short circuit.

As mentioned, to detect an equivalent amount of discharge, the sense time should be smaller for a bit line in the control die than a bit line in the memory die.

A decision step 1054 determines whether there is a next even-numbered bit line (BL) to process. If the decision step is true (T), step 1050 is reached. If the decision step is false, the process is done at step 1055.

Figure 12D:
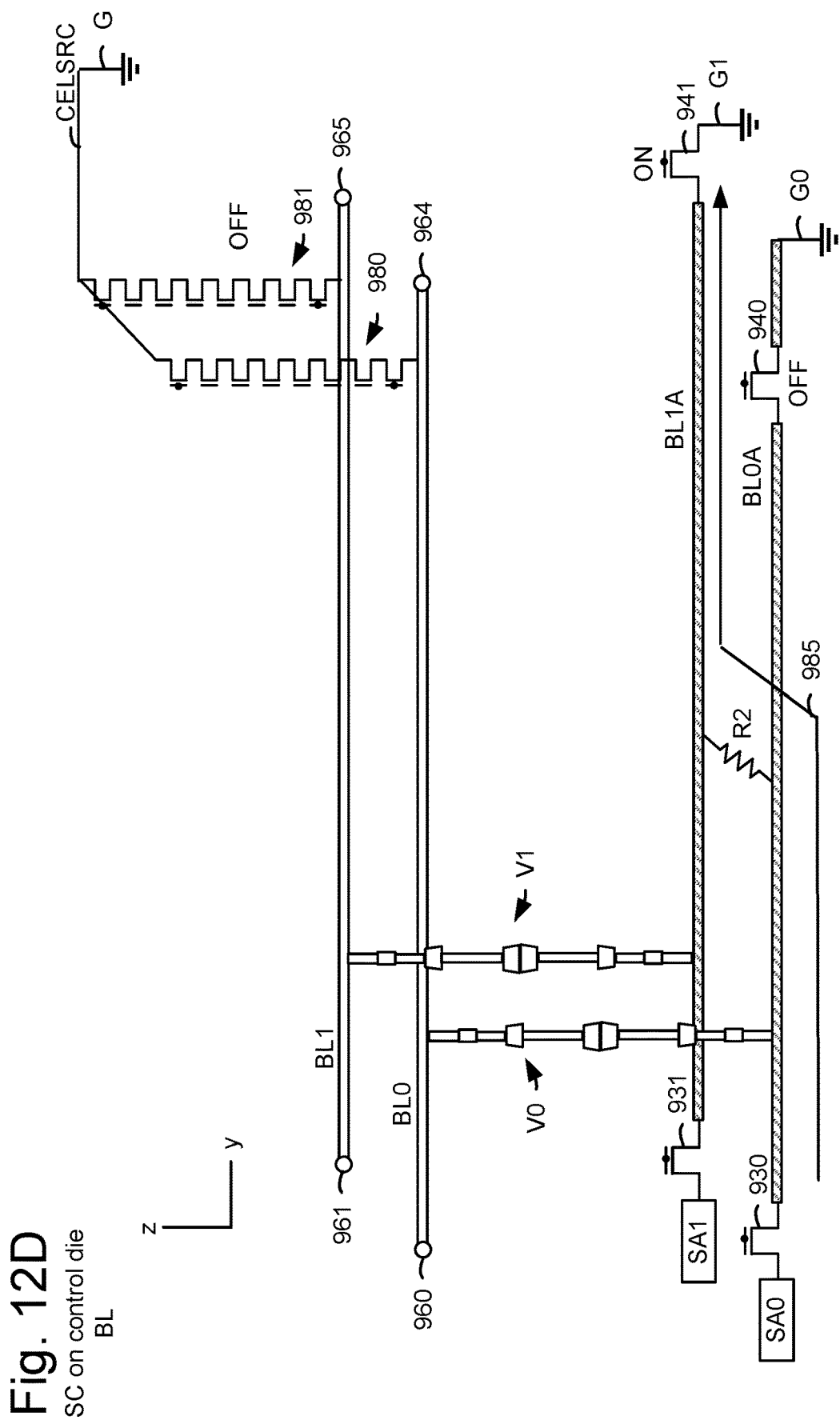
FIG. 12D depicts an example current path in BL0 and BL1 of the memory die and BL0A and BL1A of the control die of FIG. 9B when detecting a short circuit in the even-numbered bit line BL0A of the control die, consistent with FIG. 10F.

See FIG. 12D for an example.

In another option, all of the even-numbered bit lines of the control die are selected concurrently.

Figure 10G:
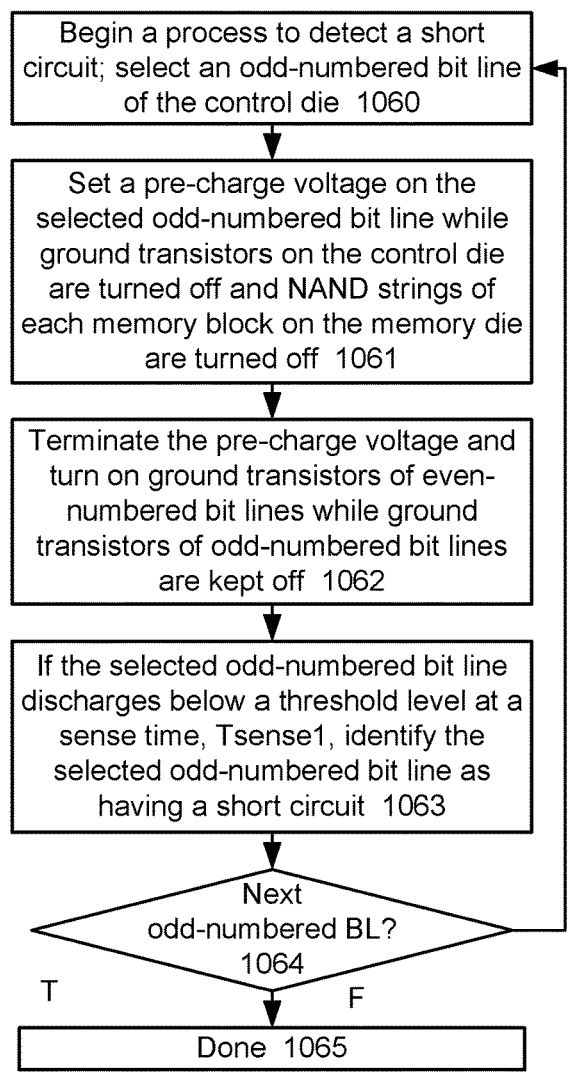
FIG. 10G is a flowchart of a process for detecting a short circuit for odd-numbered bit lines of a control die, consistent with step 1001 of FIG. 10A.

FIG. 10G is a flowchart of a process for detecting a short circuit for odd-numbered bit lines of a control die, consistent with step 1001 of FIG. 10A. Step 1060 includes beginning a process to detect a short circuit, including selecting an odd-numbered bit line of the control die. Step 1061 includes setting a pre-charge voltage on the selected odd-numbered bit line while ground transistors on the control die are turned off and NAND strings of each memory block on the memory die are turned off. Step 1062 includes terminating the pre-charge voltage and turning on ground transistors of even-numbered bit lines while ground transistors of odd-numbered bit lines are turned off. Step 1063 includes, if the selected odd-numbered bit line discharges below a threshold level at a sense time, Tsense1, identifying the selected odd-numbered bit line as having a short circuit.

A decision step 1064 determines whether there is a next odd-numbered bit line (BL) to process. If the decision step is true, step 1060 is reached. If the decision step is false, the process is done at step 1065.

In another option, all of the odd-numbered bit lines of the control die are selected concurrently.

Figure 10H:
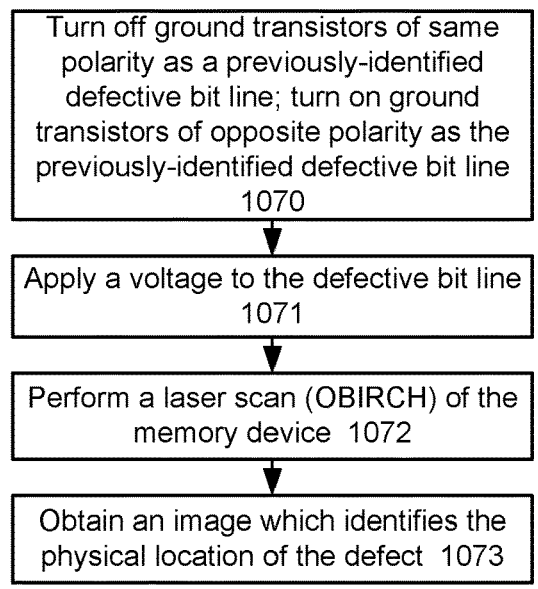
FIG. 10H is a flowchart of a process for detecting a physical location of a defect in a bit line, consistent with step 1002 of FIG. 10A.

FIG. 10H is a flowchart of a process for detecting a physical location of a defect in a bit line, consistent with step 1002 of FIG. 10A. As mentioned, after a defect such as a short circuit or open circuit is detected, the circuit 399 can be used to provide a voltage at the level of Vpre-charge or another level in a laser scanning process which detects the physical location of the defect.

Step 1070 includes turning off ground transistors of the same polarity (e.g., even or odd) as a previously-identified defective bit line, and turning on ground transistors of opposite polarity (e.g., odd or even, respectively) as the previously-identified defective bit line. Step 1071 includes applying a voltage to the defective bit line. Step 1072 includes performing a laser scan (e.g., using the OBIRCH technique) of the memory device. Step 1073 includes obtaining an image which identifies the physical location of the defect.

The laser beam may move in a raster scan pattern such as depicted in FIG. 11. As mentioned, OBIRCH is an imaging technique which uses a laser beam to induce a thermal change in the device. Laser stimulation highlights differences in thermal characteristics between areas containing defects and areas which are defect-free. As the laser locally heats a defective area on a metal line which is carrying a current, the resulting resistance changes can be detected by monitoring the input current to the device. OBIRCH is useful for detecting electromigration effects resulting in shorted metal lines.

A constant voltage is applied to the memory device. An area of interest is selected on the device, and a laser beam is used to scan the area. The input current being drawn by the device is monitored for changes during this process. When a change in current is noted, the position of the laser at the time that the change occurred is marked on the image of the device. The test equipment 141 may be used in this process.

Generally, OBIRCH detection is a current-path technique. A DC current is forced on a selected bit line which is short-circuited to a ground. Other bit lines are floated. An amplifier forces a set voltage and measures the resulting current. The laser is raster-scanned on the memory device synchronized to a stream of measurements which can be overlaid to provide an image which matches the location on the memory device. The image does not show a single hot spot, but shows multiple resistance-sensitive points in the current path.

In a memory device comprising an inverted memory die, the laser scan is done on the backside of the memory die which faces the top of the memory device. The laser causes localized heating which will change the conductivity, and hence measured current, when it coincides with the current path.

The laser must penetrate to the conducting metal lines. Silicon and SiO2 materials are transparent and do not block the laser, but metal layers do block the laser penetration. There is some laser penetration through the metal pattern gaps.

OBIRCH signals from bit lines in the memory array are typically adequate for localization, e.g., determining the physical location of a defect. However, for the control die, the OBIRCH signals can be ineffectively weak due to the metal-pattern blocking. The strong memory die OBIRCH signals overwhelm the control die signals.

If the ground path is not provided at the end of the bit lines on the control die, as described herein, a ground path would be provided instead by the source line (CELSRC) through the NAND strings of a selected memory block. With a short circuit between two bit lines, and both bit lines grounded via the source line, the current is twice the level as when a single bit line is grounded. Multiple bit line short circuits can add even more current.

In contrast, with the grounding transistors on the control die, we can change the current path to bypass the ground of the array die ground and instead provide the ground at the ends of the control die bit lines. For a selected bit line, we float the same parity bit lines (by turning off the ground transistor) and ground the opposite polarity bit lines. If there is no short circuit, no DC current will result. For a short circuit in the control die, there will be a strong current to ground through an unselected bit line of the control die, which will give a good OBIRCH signal through the short circuit path.

FIG. 11 depicts a top view of the bit lines of the memory die and the control die of FIG. 9B, showing a raster scan of a laser consistent with FIG. 10H. The bit lines BL0A-BL3A of the control die and the corresponding bit lines BL0-BL3 of the memory die are depicted. The spacing between the bit lines is shown as being greater on the control die than on the memory die, as an example. As mentioned, the laser beam can move in a raster scan or back and forth path pattern across the backside of the memory die. The raster scan moves in a direction denoted by arrows 1100-1103, for example. The scanning can be limited to a specified region of the memory device in which a defect is suspected.

FIG. 12A depicts an example configuration of BL0 of the memory die and BL0A of the control die of FIG. 9B when detecting an open circuit in BL0, consistent with FIG. 10B. "OC" denotes an open circuit. When the open circuit is in BL0, the pre-charge voltage provided on BL0A will charge up a portion BL0-1 of BL0 on a side of the open circuit which includes the via V0 but not a portion BL0-2 of BL0 on an opposite side of the open circuit. The open circuit in BL0 can be detected based on SA0 determining that BL0 does not discharge below a threshold when the NAND strings of a selected memory block are turned on and the ground transistor 940 is turned off. An example NAND string 980 is in BLK0 in this example. Generally, the selected block can be a block which is furthest from the end of the bit lines in which the pre-charge is provided, e.g., where the sense amps are located, and the via V0 should be close to the end of the bit lines in which the pre-charge is provided. This allows the open circuit to be detected over the largest range possible of BL0, e.g., from a point on BL0 which connects to V0 to a point on BL0 which connects to BLK0. The remaining blocks and NAND strings can be turned off.

In this example, the bit lines do not discharge below a threshold when the pre-charge is terminated.

FIG. 12B depicts an example configuration of BL0 of the memory die and BL0A of the control die of FIG. 9B when detecting an open circuit in BL0A, consistent with FIG. 10C. In this example, the open circuit on BL0A divides the bit line into two portions. One portion BL0A-1 is pre-charged but cannot discharge through the ground transistor 940. Another portion BL0A-2 is not pre-charged because of the open circuit. All blocks, including the selected block BLK0 and example NAND string 980, are turned off while the ground transistor 940 is turned on.

The open circuit in BL0A can be detected based on SA0 determining that BL0A does not discharge below a threshold when the ground transistor 940 is turned on and the NAND strings of each memory block are turned off.

FIG. 12C depicts an example current path 1210 in BL0 and BL1 of the memory die and BL0A and BL1A of the control die of FIG. 9B when detecting a short circuit in the even-numbered bit line BL0 of the memory die, consistent with FIG. 10D. A short circuit between BL0 and BL1 is represented by a resistor R1. Since BL0A is pre-charged, the pre-charge will charge up BL0 through V0. Moreover, due to the short circuit path, BL1 will also be charged up. BL1 can discharge through V1, BL1A and the ground transistor 941 to G1. The blocks and their NAND strings are all turned off. BL1A is not pre-charged by SA1.

The short circuit in BL0 can be detected based on SA0 determining that BL0A discharges below a threshold in a sense time, Tsense2, but not in a sense time Tsense1, as discussed in connection with FIG. 3C.

FIG. 12D depicts an example current path 985 in BL0 and BL1 of the memory die and BL0A and BL1A of the control die of FIG. 9B when detecting a short circuit in the even-numbered bit line BL0A of the control die, consistent with FIG. 10F. A short circuit between BL0A and BL1A is represented by a resistor R2. Since BL0A is pre-charged, due to the short circuit path, BL1A will also be charged up. BL1A can discharge through the ground transistor 941 to G1. The blocks and their NAND strings are all turned off.

The short circuit in BL0A can be detected based on SA0 determining that BL0A discharges below a threshold in a sense time, Tsense1, as discussed in connection with FIG. 3C.

Accordingly, it can be seen that in one implementation, an apparatus comprises: a control die configured to bond to a memory die, the memory die comprising a set of memory blocks and a set of bit lines connected to NAND strings of the set of memory blocks. The control die comprises: a set of bit lines; vias configured to connect each bit line of the set of bit lines of the control die to a corresponding bit line of the set of bit lines of the memory die; a set of ground transistors connected to one end of the set of bit lines of the control die, the set of ground transistors comprise even-numbered ground transistors connected to even-numbered bit lines of the set of bit lines of the control die and odd-numbered ground transistors connected to odd-numbered bit lines of the set of bit lines of the control die; and sense circuits connected to another end of the set of bit lines of the control die.

In another implementation, a method comprises: pre-charging a selected even-numbered bit line of a set of bit lines of a control die, the control die is bonded to a memory die comprising a set of memory blocks and a set of bit lines connected to the set of memory blocks, each bit line of the set of bit lines of the control die is connected to a corresponding bit line of the set of bit lines of the memory die; and after the pre-charging of the selected even-numbered bit line, determining whether the selected even-numbered bit line discharges below a threshold level at a sense time while odd-numbered bit lines of the set of bit lines of the control die are grounded and even-numbered bit lines of the set of bit lines of the control die are not grounded.

In another implementation, an apparatus comprises: a memory die comprising a set of memory blocks, each set of memory blocks comprising NAND strings, a set of bit lines connected to the NAND strings, and memory die vias connected from the set of bit lines of the memory die to bond pads of the memory die; and a control die comprising a set of bit lines extending parallel to the set of bit lines of the memory die, control die vias connected from the set of bit lines of the control die to bond pads of the control die, the bond pads of the control die are connected to the bond pads of the memory die, sense circuits connected to a first end of the set of bit lines of the control die and to a set of ground transistors connected to a second end of the set of bit lines of the control die, the set of ground transistors comprise even-numbered ground transistors connected to even-numbered bit lines of the set of bit lines of the control die and odd-numbered ground transistors connected to odd-numbered bit lines of the set of bit lines of the control die.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. An apparatus, comprising:
a control die configured to bond to a memory die, the memory die comprising a set of memory blocks and a set of bit lines connected to NAND strings of the set of memory blocks, the control die comprising:
a set of bit lines;
vias configured to connect each bit line of the set of bit lines of the control die to a corresponding bit line of the set of bit lines of the memory die;
a set of ground transistors connected to one end of the set of bit lines of the control die, the set of ground transistors comprise even-numbered ground transistors connected to even-numbered bit lines of the set of bit lines of the control die and odd-numbered ground transistors connected to odd-numbered bit lines of the set of bit lines of the control die; and
sense circuits connected to another end of the set of bit lines of the control die, wherein, to detect an open circuit, the sense circuits are configured to set a pre-charge voltage on the set of bit lines of the control die or the set of bit lines of the memory die while the set of ground transistors are turned off and the NAND strings of each memory block are turned off, then terminate the pre-charge voltage and detect a bit line of the set of bit lines of the control die or the set of bit lines of the memory die which does not discharge below a threshold level at a sense time when the set of ground transistors are turned on and the NAND strings of each memory block are turned off.

2. The apparatus of claim 1, wherein:
to detect an open circuit in the set of bit lines of the control die, the sense circuits are configured to set the pre-charge voltage on the set of bit lines of the control die while the set of ground transistors are turned off and the NAND strings of each memory block are turned off, then terminate the pre-charge voltage and detect the bit line of the set of bit lines of the control die which does not discharge below a threshold level at a sense time when the set of ground transistors are turned on and the NAND strings of each memory block are turned off.

3. The apparatus of claim 2, wherein:
the bit line which does not discharge below the threshold level at the sense time is prevented from discharging through the set of blocks when the NAND strings of each block are turned off, prevented from discharging through the set of ground transistors when the set of ground transistors are turned off and prevented from discharging below the threshold level at the sense time through the set of ground transistors when the set of ground transistors are turned on due to the open circuit.

4. The apparatus of claim 1, wherein:
to detect an open circuit in the set of bit lines of the memory die, the sense circuits are configured to set the pre-charge voltage on the set of bit lines of the memory die while the set of ground transistors are turned off and the NAND strings of each memory block are turned off, then terminate the pre-charge voltage and detect the bit line of the set of bit lines of the memory die which does not discharge below a threshold level at a sense time when NAND strings of a selected memory block are turned on and the set of ground transistors are turned off.

5. The apparatus of claim 4, wherein:
the set of bit lines of the memory die are prevented from discharging through the set of blocks when the NAND strings of each block are turned off, prevented from discharging through the set of ground transistors when the set of ground transistors are turned off and prevented from discharging through the NAND strings of the selected memory block when the NAND strings of the selected memory block are turned on due to the open circuit.

6. The apparatus of claim 1, wherein to detect a short circuit in a selected even-numbered bit line of the set of bit lines of the control die, a sense circuit connected to the selected even-numbered bit line is configured to:
set a pre-charge voltage on the selected even-numbered bit line while the set of ground transistors is turned off and NAND strings of each block are turned off, then terminate the pre-charge voltage and detect whether the selected even-numbered bit line discharges below a threshold level at a sense time (Tsense1) when the odd-numbered ground transistors are turned on and the even-numbered ground transistors are turned off.

7. The apparatus of claim 6, wherein:
the selected even-numbered bit line is prevented from discharging through the set of blocks when the NAND strings of each block are turned off and prevented from discharging through the even-numbered ground transistors when the even-numbered ground transistors are turned off; and
when the selected even-numbered bit line has a short circuit, the selected even-numbered bit line discharges through an adjacent odd-numbered ground transistor when the odd-numbered ground transistors are turned on.

8. The apparatus of claim 6, wherein:
the control die is configured to bond to the memory die when the memory die is in an inverted position; and
a location of the short circuit in the selected even-numbered bit line is determined using an Optical Beam Induced Resistance Change (OBIRCH) imaging technique in which a laser is raster scanned at a backside of the memory die while a voltage is applied to the selected even-numbered bit line, the odd-numbered ground transistors are turned on and the even-numbered ground transistors are turned off.

9. The apparatus of claim 6, wherein to detect a short circuit in a selected odd-numbered bit line of the set of bit lines of the control die, adjacent to the selected even-numbered bit line, a sense circuit connected to the selected odd-numbered bit line is configured to:
set a pre-charge voltage on the selected odd-numbered bit line while the set of ground transistors is turned off and NAND strings of each block are turned off, then terminate the pre-charge voltage and detect whether the selected odd-numbered bit line discharges below a threshold level at the sense time (Tsense1) when the even-numbered ground transistors are turned on and the odd-numbered ground transistors are turned off.

10. The apparatus of claim 6, wherein to detect a short circuit in a selected even-numbered bit line of the set of bit lines of the memory die, a sense circuit connected to a corresponding even-numbered bit line of the control die is configured to:
set a pre-charge voltage on the selected even-numbered bit line of the memory die while the set of ground transistors is turned off and NAND strings of each block are turned off, then terminate the pre-charge voltage and detect whether the selected even-numbered bit line of the memory die discharges below a threshold level at a sense time (Tsense2) when the odd-numbered ground transistors are turned on and the even-numbered ground transistors are turned off, wherein the sense time used for the selected even-numbered bit line of the control die is less than the sense time used for the selected even-numbered bit line of the memory die.

11. The apparatus of claim 1, wherein to detect a short circuit in a selected even-numbered bit line of the set of bit lines of the memory die, a sense circuit connected to a corresponding even-numbered bit line of the control die is configured to:
set a pre-charge voltage on the selected even-numbered bit line of the memory die while the set of ground transistors is turned off and NAND strings of each block are turned off, then terminate the pre-charge voltage and detect whether the selected even-numbered bit line of the memory die discharges below a threshold level at a greater sense time (Tsense2) but not at a lesser sense time (Tsense1) when the odd-numbered ground transistors are turned on and the even-numbered ground transistors are turned off.

12. A method, comprising:
pre-charging a selected even-numbered bit line of a set of bit lines of a control die, the control die is bonded to a memory die comprising a set of memory blocks and a set of bit lines connected to the set of memory blocks, each bit line of the set of bit lines of the control die is connected to a corresponding bit line of the set of bit lines of the memory die, the set of memory blocks including NAND strings that are turned off during the pre-charging; and
after the pre-charging of the selected even-numbered bit line, determining whether the selected even-numbered bit line discharges below a threshold level at a sense time while odd-numbered bit lines of the set of bit lines of the control die are grounded, and even-numbered bit lines of the set of bit lines of the control die are not grounded and the NAND strings in the set of memory blocks are turned off to prevent a discharge of the selected even-numbered bit line through the set of blocks.

13. The method of claim 12, the method further comprising:
using an Optical Beam Induced Resistance Change (OBIRCH) imaging technique in which a laser is raster scanned at a backside of the memory die while a voltage is applied to the selected even-numbered bit line, the odd-numbered ground transistors are turned on and the even-numbered ground transistors are turned off.

14. The method of claim 12, wherein:
the grounding of the odd-numbered bit lines comprises turning on ground transistors connected to the odd-numbered bit lines while ground transistors connected to the even-numbered bit lines are turned off.

15. The method of claim 12, wherein:
the control die is bonded to the memory die when the memory die is in an inverted position; and
the set of bit lines of the control die extend parallel to the set of bit lines of the memory die and have a length equal to a length of the set of bit lines of the memory die +/−20%.

16. An apparatus, comprising:
a memory die comprising a set of memory blocks, each set of memory blocks comprising NAND strings, a set of bit lines connected to the NAND strings, and memory die vias connected from the set of bit lines of the memory die to bond pads of the memory die; and
a control die comprising a set of bit lines extending parallel to the set of bit lines of the memory die, control die vias connected from the set of bit lines of the control die to bond pads of the control die, the bond pads of the control die are connected to the bond pads of the memory die, sense circuits connected to a first end of the set of bit lines of the control die and to a set of ground transistors connected to a second end of the set of bit lines of the control die, the set of ground transistors comprise even-numbered ground transistors connected to even-numbered bit lines of the set of bit lines of the control die and odd-numbered ground transistors connected to odd-numbered bit lines of the set of bit lines of the control die, wherein the control die is configured to apply a voltage to a previously-identified defective bit line of the control die while ground transistors having a same polarity as the previously-identified defective bit line are turned off, ground transistors having an opposite polarity as the previously-identified defective bit line are turned on, and a laser is raster scanned at a backside of the memory die during an Optical Beam Induced Resistance Change imaging technique.

17. The apparatus of claim 16, wherein:
the set of bit lines of the control die extend parallel to the set of bit lines of the memory die and have a length equal to a length of the set of bit lines of the memory die +/−20%.

18. The apparatus of claim 16, further comprising:
a first control line connected to control gates of the even-numbered ground transistors; and
a second control line connected to control gates of the odd-numbered ground transistors.

19. The apparatus of claim 18, further comprising:
a control circuit configured to connect to the first and second control lines, the control circuit is configured to control the even-numbered ground transistors and the odd-numbered ground transistors to detect a short-circuited bit line in the set of bit lines of the control die.

20. The apparatus of claim 18, further comprising:
a control circuit configured to connect to the first and second control lines, the control circuit is configured to control the even-numbered ground transistors and the odd-numbered ground transistors while the laser is raster scanned at the backside of the memory die.

* * * * *